US008466366B2

(12) United States Patent
Srinivas et al.

(10) Patent No.: US 8,466,366 B2
(45) Date of Patent: Jun. 18, 2013

(54) TRANSPARENT CONDUCTORS INCORPORATING ADDITIVES AND RELATED MANUFACTURING METHODS

(75) Inventors: Arjun Daniel Srinivas, San Francisco, CA (US); Matthew R. Robinson, San Francisco, CA (US); Michael Eugene Young, Emeryville, CA (US)

(73) Assignee: Innova Dynamics, Inc., San Francisco, CA (US)

( * ) Notice: Subject to any disclaimer, the term of this patent is extended or adjusted under 35 U.S.C. 154(b) by 0 days.

(21) Appl. No.: 13/536,968

(22) Filed: Jun. 28, 2012

(65) Prior Publication Data
US 2013/0000952 A1    Jan. 3, 2013

Related U.S. Application Data

(60) Provisional application No. 61/502,174, filed on Jun. 28, 2011, provisional application No. 61/502,169, filed on Jun. 28, 2011, provisional application No. 61/502,180, filed on Jun. 28, 2011, provisional application No. 61/548,001, filed on Oct. 17, 2011, provisional application No. 61/547,995, filed on Oct. 17, 2011, provisional application No. 61/547,983, filed on Oct. 17, 2011, provisional application No. 61/560,475, filed on Nov. 16, 2011, provisional application No. 61/563,454, filed on Nov. 23, 2011.

(51) Int. Cl.
*H01B 5/00* (2006.01)

(52) U.S. Cl.
USPC .................... 174/126.1; 174/126.2

(58) Field of Classification Search
USPC .............................. 174/102 SC, 126.1, 126.2
See application file for complete search history.

(56) References Cited

U.S. PATENT DOCUMENTS

| | | | |
|---|---|---|---|
| 5,071,800 A * | 12/1991 | Iwamoto et al. | 501/126 |
| 5,474,814 A | 12/1995 | Komatsu et al. | |
| 5,492,769 A | 2/1996 | Pryor et al. | |
| 5,879,740 A | 3/1999 | Miyazaki | |
| 6,156,550 A | 12/2000 | Glad | |
| 6,187,448 B1 | 2/2001 | Hanoka | |
| 7,960,027 B2 | 6/2011 | Guiheen et al. | |
| 2002/0115747 A1 | 8/2002 | Feldheim et al. | |
| 2002/0175408 A1 | 11/2002 | Majumdar et al. | |
| 2004/0169151 A1 | 9/2004 | Yagi et al. | |
| 2006/0194037 A1 | 8/2006 | Fink et al. | |

(Continued)

FOREIGN PATENT DOCUMENTS

| WO | WO 2005/089480 A2 | 9/2005 |
|---|---|---|
| WO | WO 2007-013871 | 2/2007 |

(Continued)

OTHER PUBLICATIONS

Australian Patent Application No. 2008260162 in the name of Innova Dynamics, Inc. Examination Report (Feb. 6, 2012).

(Continued)

*Primary Examiner* — Chau Nguyen
(74) *Attorney, Agent, or Firm* — Foley & Lardner LLP

(57) ABSTRACT

A transparent conductor includes a film of a conductive ceramic. Additives are at least partially incorporated into the film. The additives are at least one of electrically conductive and semiconducting, and at least one of the additives has an aspect ratio of at least 3.

4 Claims, 16 Drawing Sheets

U.S. PATENT DOCUMENTS

| | | | |
|---|---|---|---|
| 2006/0257638 A1* | 11/2006 | Glatkowski et al. | 428/292.1 |
| 2007/0065651 A1* | 3/2007 | Glatkowski et al. | 428/297.4 |
| 2007/0298253 A1 | 12/2007 | Hata et al. | |
| 2008/0143906 A1 | 6/2008 | Allemand et al. | |
| 2008/0193634 A1 | 8/2008 | Yaniv et al. | |
| 2008/0259262 A1 | 10/2008 | Jones et al. | |
| 2008/0276987 A1 | 11/2008 | Flood | |
| 2009/0165844 A1 | 7/2009 | Dutta | |
| 2009/0188697 A1 | 7/2009 | Guiheen et al. | |
| 2009/0229652 A1 | 9/2009 | Mapel et al. | |
| 2010/0012190 A1 | 1/2010 | Goto et al. | |
| 2010/0230344 A1 | 9/2010 | Srinivas et al. | |
| 2011/0139253 A1* | 6/2011 | Wachi et al. | 136/263 |
| 2011/0217544 A1 | 9/2011 | Young et al. | |
| 2011/0281070 A1 | 11/2011 | Mittal et al. | |
| 2012/0098419 A1* | 4/2012 | Chiba et al. | 313/504 |
| 2012/0132930 A1 | 5/2012 | Young et al. | |

FOREIGN PATENT DOCUMENTS

| | | |
|---|---|---|
| WO | WO 2008/150867 A2 | 12/2008 |
| WO | WO 2008/150867 A3 | 12/2008 |
| WO | WO 2010/022353 A1 | 2/2010 |
| WO | WO 2010/030374 A2 | 3/2010 |
| WO | WO 2010/150619 * | 12/2010 |
| WO | WO 2011/106730 A2 | 9/2011 |
| WO | WO 2011/106730 A3 | 9/2011 |
| WO | WO 2012/021460 A2 | 2/2012 |
| WO | WO 2012/021460 A3 | 2/2012 |
| WO | WO 2012/021460 A9 | 2/2012 |

OTHER PUBLICATIONS

Chinese Patent Application No. 200880100186.0 in the name of Innova Materials, LLC. Notification of $2^{nd}$ Office Action (Apr. 28, 2012).

European Patent Application No. 08756437.3. Supplementary Search Report (Sep. 26, 2011).

Hu, et al., "Scalable coating and properties of transparent, flexible, silver nanowire electrodes." ACS Nano, vol. 4:5, 2955-2963 (2010).

PCT/US2011/026362. Int'l Search Report—Written Opinion (Oct. 10, 2011).

PCT/US2011/046969. Int'l Search Report (Feb. 20, 2012).

* cited by examiner

TRANSPARENT CONDUCTORS INCORPORATING ADDITIVES AND RELATED MANUFACTURING METHODS

CROSS REFERENCE TO RELATED APPLICATIONS

This application claims the benefit of U.S. Provisional Application No. 61/502,169, filed on Jun. 28, 2011, U.S. Provisional Application No. 61/547,983, filed on Oct. 17, 2011, U.S. Provisional Application No. 61/502,174, filed on Jun. 28, 2011, U.S. Provisional Application No. 61/547,995, filed on Oct. 17, 2011, U.S. Provisional Application No. 61/502,180, filed on Jun. 28, 2011, U.S. Provisional Application No. 61/548,001, filed on Oct. 17, 2011, U.S. Provisional Application No. 61/560,475, filed on Nov. 16, 2011, and U.S. Provisional Application No. 61/563,454, filed on Nov. 23, 2011, the disclosures of which are incorporated herein by reference in their entireties.

FIELD OF THE INVENTION

The invention relates generally to structures incorporating additives. More particularly, the invention relates to transparent conductors incorporating additives to impart improved functionality such as electrical conductivity.

BACKGROUND

A transparent conductor permits the transmission of light while providing a conductive path for an electric current to flow through a device including the transparent conductor. Traditionally, a transparent conductor is formed as a coating of a doped metal oxide, such as tin-doped indium oxide (or ITO), which is disposed on top of a glass or plastic film substrate. ITO coatings are typically formed through the use of a dry process, such as through the use of specialized physical vapor deposition (e.g., sputtering) or specialized chemical vapor deposition techniques. The resulting coating can exhibit good transparency and good electrical conductivity. However, drawbacks to such techniques include high cost, high process complexity, intensive energy requirements, high capital expenditures for equipment, and poor productivity.

It is against this background that a need arose to develop the transparent conductors and related manufacturing methods described herein.

SUMMARY

One aspect of the invention relates to a transparent conductor. In one embodiment, the transparent conductor includes a film of a conductive ceramic. Additives are at least partially incorporated into the film. The additives are at least one of electrically conductive and semiconducting, and at least one of the additives has an aspect ratio of at least 3.

In another embodiment, the transparent conductor includes a ceramic material having an embedding surface. Additives are partially embedded into the ceramic material, and are localized within an embedded region adjacent to the embedding surface. A thickness of the embedded region is no greater than 50% of an overall thickness of the ceramic material, and the additives are at least one of electrically conductive and semiconducting. In some implementations, the transparent conductor also includes an over-coating adjacent to the embedding surface and covering portions of the additives exposed from the ceramic material.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

Figure 1A:
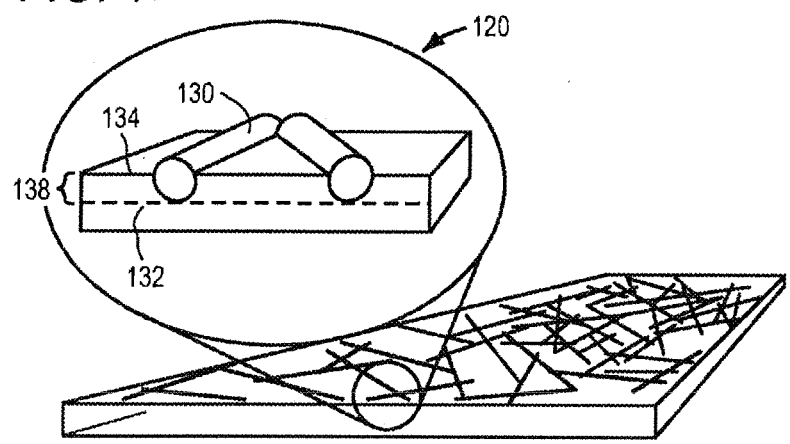
FIG. 1A and FIG. 1B illustrate transparent conductors implemented in accordance with embodiments of the invention.

The following definitions apply to some of the aspects described with regard to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set can also be referred to as members of the set. Objects of a set can be the same or different. In some instances, objects of a set can share one or more common characteristics.

As used herein, the term "adjacent" refers to being near or adjoining. Adjacent objects can be spaced apart from one another or can be in actual or direct contact with one another. In some instances, adjacent objects can be connected to one another or can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "optional" and "optionally" mean that the subsequently described event or circumstance may or may not occur and that the description includes instances where the event or circumstance occurs and instances in which it does not.

As used herein, relative terms, such as "inner," "interior," "outer," "exterior," "top," "bottom," "front," "rear," "back," "upper," "upwardly," "lower," "downwardly," "vertical," "vertically," "lateral," "laterally," "above," and "below," refer to an orientation of a set of objects with respect to one another, such as in accordance with the drawings, but do not require a particular orientation of those objects during manufacturing or use.

As used herein, the term "nanometer range" or "nm range" refers to a range of dimensions from about 1 nm to about 1 micrometer ("μm"). The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 μm.

As used herein, the term "micrometer range" or "μm range" refers to a range of dimensions from about 1 μm to about 1 millimeter ("mm"). The μm range includes the "lower μm range," which refers to a range of dimensions from about 1 μm to about 10 μm, the "middle μm range," which refers to a range of dimensions from about 10 μm to about 100 μm, and the "upper μm range," which refers to a range of dimensions from about 100 μm to about 1 mm.

As used herein, the term "aspect ratio" refers to a ratio of a largest dimension or extent of an object and an average of remaining dimensions or extents of the object, where the remaining dimensions are orthogonal with respect to one another and with respect to the largest dimension. In some instances, remaining dimensions of an object can be substantially the same, and an average of the remaining dimensions can substantially correspond to either of the remaining dimensions. For example, an aspect ratio of a cylinder refers to a ratio of a length of the cylinder and a cross-sectional diameter of the cylinder. As another example, an aspect ratio of a spheroid refers to a ratio of a major axis of the spheroid and a minor axis of the spheroid.

As used herein, the term "nano-sized" object refers to an object that has at least one dimension in the nm range. A nano-sized object can have any of a wide variety of shapes, and can be formed of a wide variety of materials. Examples of nano-sized objects include nanowires, nanotubes, nanoplatelets, nanoparticles, and other nanostructures.

As used herein, the term "nanowire" refers to an elongated, nano-sized object that is substantially solid. Typically, a nanowire has a lateral dimension (e.g., a cross-sectional dimension in the form of a width, a diameter, or a width or diameter that represents an average across orthogonal directions) in the nm range, a longitudinal dimension (e.g., a length) in the μm range, and an aspect ratio that is about 3 or greater.

As used herein, the term "nanoplatelet" refers to a planar-like nano-sized object that is substantially solid.

As used herein, the term "nanotube" refers to an elongated, hollow, nano-sized object. Typically, a nanotube has a lateral dimension (e.g., a cross-sectional dimension in the form of a width, an outer diameter, or a width or outer diameter that represents an average across orthogonal directions) in the nm range, a longitudinal dimension (e.g., a length) in the μm range, and an aspect ratio that is about 3 or greater.

As used herein, the term "nanoparticle" refers to a spheroidal, nano-sized object. Typically, each dimension (e.g., a cross-sectional dimension in the form of a width, a diameter, or a width or diameter that represents an average across orthogonal directions) of a nanoparticle is in the nm range, and the nanoparticle has an aspect ratio that is less than about 3, such as about 1.

As used herein, the term "micron-sized" object refers to an object that has at least one dimension in the μm range. Typically, each dimension of a micron-sized object is in the μm range or beyond the μm range. A micron-sized object can have any of a wide variety of shapes, and can be formed of a wide variety of materials. Examples of micron-sized additives include microwires, microtubes, microparticles, and other microstructures.

As used herein, the term "microwire" refers to an elongated, micron-sized object that is substantially solid. Typically, a microwire has a lateral dimension (e.g., a cross-sectional dimension in the form of a width, a diameter, or a width or diameter that represents an average across orthogonal directions) in the μm range and an aspect ratio that is about 3 or greater.

As used herein, the term "microtube" refers to an elongated, hollow, micron-sized object. Typically, a microtube has a lateral dimension (e.g., a cross-sectional dimension in the form of a width, an outer diameter, or a width or outer diameter that represents an average across orthogonal directions) in the μm range and an aspect ratio that is about 3 or greater.

As used herein, the term "microparticle" refers to a spheroidal, micron-sized object. Typically, each dimension (e.g., a cross-sectional dimension in the form of a width, a diameter, or a width or diameter that represents an average across orthogonal directions) of a microparticle is in the μm range, and the microparticle has an aspect ratio that is less than about 3, such as about 1.

As used herein, the term "ceramic" refers to an inorganic, non-metallic material, which can be solid or solid-like. The term "ceramic" encompasses crystalline or partly crystalline materials as well as non-crystalline or amorphous materials, such as glasses. The term "ceramic" encompasses, but is not limited to, materials such as oxides, such as alumina, silica, and titania, non-oxides, such as carbides, borides, and nitrides, and composite materials, such as particulate reinforced or fiber reinforced oxides, non-oxides or combinations of oxides and non-oxides.

Transparent Conductors

Embodiments of the invention relate to electrically conductive or semiconducting additives that are incorporated into host materials for use as transparent conductors or other types of conductive structures. Embodiments of transparent conductors exhibit improved performance (e.g., higher electrical and thermal conductivity and higher light transmittance), as well as cost benefits arising from their structure, composition, and manufacturing process. In some embodiments, transparent conductors can be manufactured by a surface embedding process in which additives are physically embedded into a host material, while preserving desired characteristics of the host material (e.g., transparency) and imparting additional desired characteristics to the resulting transparent conductors (e.g., electrical conductivity). In other embodiments, transparent conductors can be manufactured by bulk incorporation of additives into a host material, or by over-coating additives with a host material or a host material precursor. In other embodiments, an over-coating can be a host material or a host material precursor.

One aspect of certain transparent conductors described herein is the provision of a vertical additive concentration gradient or profile in a host material, namely a gradient or profile along a thickness direction of the host material. Bulk incorporation within a substrate or a coating aims to provide a relatively uniform vertical additive concentration profile throughout the substrate or the coating. In contrast, certain transparent conductors described herein allow for variable, controllable vertical additive concentration profile, in accordance with a localization of additives within an embedded region of a host material. For certain implementations, the extent of localization of additives within an embedded region is such that at least a majority (by weight, volume, or number density) of the additives are included within the embedded region, such as at least about 60% (by weight, volume, or number density) of the additives are so included, at least about 70% (by weight, volume, or number density) of the additives are so included, at least about 80% (by weight, volume, or number density) of the additives are so included, at least about 90% (by weight, volume, or number density) of the additives are so included, or at least about 95% (by weight, volume, or number density) of the additives are so included. For example, substantially all of the additives can be localized within the embedded region, such that a remainder of the host material is substantially devoid of the additives. For certain applications, bulk incorporation can be used in place of, or in combination with, localization of additives within an embedded region.

Additives can be in the form of nano-sized additives, micron-sized additives, or a combination thereof. To impart electrical conductivity, additives can include an electrically conductive material, a semiconductor, or a combination thereof.

Additives also can be arranged in the form of structured or patterned grids. For example, a grid of metal nanowires can be used, wherein each wire in the grid is opaque (e.g. <10 µm, <5 µm, <1 µm), but because of the spacing between each wire, the transparency can still be high. These patterned grids can be printed, etched, photographically developed, metallized, or by other techniques as well.

Examples of electrically conductive materials include metals (e.g., silver, copper, and gold in the form of silver nanowires, copper nanowires, and gold nanowires), metal alloys, carbon-based conductors (e.g., in the form of carbon nanotubes, graphene, and buckyballs), conductive ceramics (e.g., conducting oxides and chalcogenides that are optionally doped and transparent, such as metal oxides and chalcogenides that are optionally doped and transparent), electrically conductive polymers (e.g., polyaniline, poly(acetylene), poly(pyrrole), poly(thiophene), poly(p-phenylene sulfide), poly(p-phenylene vinylene) (or PPV), poly(3-alkylthiophene), olyindole, polypyrene, polycarbazole, polyazulene, polyazepine, poly(fluorene), polynaphthalene, melanins, poly(3,4-ethylenedioxythiophene) (or PEDOT), poly (styrenesulfonate) (or PSS), PEDOT-PSS, PEDOT-polymethacrylic acid (or PEDOT-PMA), poly(3-hexylthiophene) (or P3HT), poly(3-octylthiophene) (or P3OT), poly(C-61-butyric acid-methyl ester) (or PCBM), and poly[2-methoxy-5-(2'-ethyl-hexyloxy)-1,4-phenylene vinylene] (or MEH-PPV)), and any combination thereof. Further details regarding metal oxides and chalcogenides are set forth the sections below.

Examples of semiconductor materials include semiconducting polymers, Group IVB elements (e.g., carbon (or C), silicon (or Si), and germanium (or Ge)), Group IVB-IVB binary alloys (e.g., silicon carbide (or SiC) and silicon germanium (or SiGe)), Group IIB-VIB binary alloys (e.g., cadmium selenide (or CdSe), cadmium sulfide (or CdS), cadmium telluride (or CdTe), zinc oxide (or ZnO), zinc selenide (or ZnSe), zinc telluride (or ZnTe), and zinc sulfide (or ZnS)), Group IIB-VIB ternary alloys (e.g., cadmium zinc telluride (or CdZnTe), mercury cadmium telluride (or HgCdTe), mercury zinc telluride (or HgZnTe), and mercury zinc selenide (or HgZnSe)), Group IIIB-VB binary alloys (e.g., aluminum antimonide (or AlSb), aluminum arsenide (or AlAs), aluminium nitride (or AN), aluminium phosphide (or AlP), boron nitride (or BN), boron phosphide (or BP), boron arsenide (or BAs), gallium antimonide (or GaSb), gallium arsenide (or GaAs), gallium nitride (or GaN), gallium phosphide (or GaP), indium antimonide (or InSb), indium arsenide (or InAs), indium nitride (or InN), and indium phosphide (or InP)), Group IIIB-VB ternary alloys (e.g., aluminium gallium arsenide (or AlGaAs or $Al_xGa_{1-x}As$), indium gallium arsenide (or InGaAs or $In_xGa_{1-x}As$), indium gallium phosphide (or InGaP), aluminium indium arsenide (or AlInAs), aluminium indium antimonide (or AlInSb), gallium arsenide nitride (or GaAsN), gallium arsenide phosphide (or GaAsP), aluminium gallium nitride (or AlGaN), aluminium gallium phosphide (or AlGaP), indium gallium nitride (or InGaN), indium arsenide antimonide (or InAsSb), and indium gallium antimonide (or InGaSb)), Group IIIB-VB quaternary alloys (e.g., aluminium gallium indium phosphide (or AlGaInP), aluminium gallium arsenide phosphide (or AlGaAsP), indium gallium arsenide phosphide (or InGaAsP), aluminium indium arsenide phosphide (or AlInAsP), aluminium gallium arsenide nitride (or AlGaAsN), indium gallium arsenide nitride (or InGaAsN), indium aluminium arsenide nitride (or InAlAsN), and gallium arsenide antimonide nitride (or GaAsSbN)), and Group IIIB-VB quinary alloys (e.g., gallium indium nitride arsenide antimonide (or GaInNAsSb) and gallium indium arsenide antimonide phosphide (or GaInAsSbP)), Group IB-VIIB binary alloys (e.g., cuprous chloride (or CuCl)), Group IVB-VIB binary alloys (e.g., lead selenide (or PbSe), lead sulfide (or PbS), lead telluride (or PbTe), tin sulfide (or SnS), and tin telluride (or SnTe)), Group IVB-VIB ternary alloys (e.g., lead tin telluride (or PbSnTe), thallium tin telluride (or $Tl_2SnTe_5$), and thallium germanium telluride (or $Tl_2GeTe_5$)), Group VB-VIB binary alloys (e.g., bismith telluride (or $Bi_2Te_3$)), Group IIB-VB binary alloys (e.g., cadmium phosphide (or $Cd_3P_2$), cadmium arsenide (or $Cd_3As_2$), cadmium antimonide (or $Cd_3Sb_2$), zinc phosphide (or $Zn_3P_2$), zinc arsenide (or $Zn_3As_2$), and zinc antimonide (or $Zn_3Sb_2$)), and other binary, ternary, quaternary, or higher order alloys of Group IB (or Group 11) elements, Group JIB (or Group 12) elements, Group IIIB (or Group 13) elements, Group IVB (or Group 14) elements, Group VB (or Group 15) elements, Group VIB (or Group 16) elements, and Group VIIB (or Group 17) elements, such as copper indium gallium selenide (or CIGS), as well as any combination thereof.

Additives can include, for example, metallic or semiconducting nanoparticles, nanowires (e.g. silver, copper, or zinc), nanoplates, nanoflakes, nanofibers, nanorods, nanotubes (e.g., carbon nanotubes, multi-walled nanotubes ("MWNTs"), single-walled nanotubes ("SWNTs"), double-walled nanotubes ("DWNTs"), graphitized or modified nanotubes), fullerenes, buckyballs, graphene, microparticles, microwires, microtubes, core-shell nanoparticles or microparticles, core-multishell nanoparticles or microparticles, core-shell nanowires, and other additives having shapes that are substantially tubular, cubic, spherical, or pyramidal, and characterized as amorphous, crystalline, tetragonal, hexagonal, trigonal, orthorhombic, monoclinic, or triclinic, or any combination thereof.

Examples of core-shell nanoparticles and core-shell nanowires include those with a ferromagnetic core (e.g., iron, cobalt, nickel, manganese, as well as their oxides and alloys formed with one or more of these elements), with a shell formed of a metal, a metal alloy, a metal oxide, carbon, or any combination thereof (e.g., silver, copper, gold, platinum, a conducting oxide or chalcogenide, graphene, and other materials listed as suitable additives herein). A particular example of a core-shell nanowire is one with a silver core and a gold shell (or a platinum shell or another type of shell) surrounding the silver core to reduce or prevent oxidation of the silver core. Another example of a core-shell nanowire is one with a silver core (or a core formed of another metal or other electrically conductive material), with a shell or other coating formed of one or more of the following: (a) conducting polymers, such as poly(3,4-ethylenedioxythiophene) (or PEDOT) and polyaniline (or PANI); (b) conducting oxides, chalcogenides, and ceramics (e.g., deposited by sol-gel, chemical vapor deposition, physical vapor deposition, plasma-enhanced chemical vapor deposition, or chemical bath deposition); (c) insulators in the form of ultra-thin layers, such as polymers, $SiO_2$, $BaTiO$, and $TiO_2$; and (d) thin layers of metals, such as gold, copper, nickel, chromium, molybdenum, and tungsten. Such coated or core-shell form of nanowires can be desirable to impart electrical conductivity, while avoiding or reducing adverse interactions with a host material, such as potential yellowing or other discoloration in the presence of a metal such as silver, oxidation (e.g., a silver/gold core/shell nanowires can have substantially lower oxidation due to the gold shell), and sulfidation (e.g., a silver/platinum core/shell nanowire can have substantially lower sulfidation due to the platinum shell).

For certain implementations, high aspect ratio additives are desirable, such as in the form of nanowires, nanotubes, and combinations thereof. For example, desirable additives include nanotubes formed of carbon or other materials (e.g., MWNTs, SWNTs, graphitized MWNTs, graphitized SWNTs, modified MWNTs, modified SWNTs, and polymer-containing nanotubes), nanowires formed of a metal, a metal oxide, a metal alloy, or other materials (e.g., silver nanowires, copper nanowires, zinc oxide nanowires (undoped or doped by, for example, aluminum, boron, fluorine, and others), tin oxide nanowires (undoped or doped by, for example, fluorine), cadmium tin oxide nanowires, ITO nanowires, polymer-containing nanowires, and gold nanowires), as well as other materials that are electrically conductive or semiconducting and having a variety of shapes, whether cylindrical, spherical, pyramidal, or otherwise. Additional examples of additives include those formed of activated carbon, graphene, carbon black, ketjen black, and nanoparticles formed of a metal, a metal oxide, a metal alloy, or other materials (e.g., silver nanoparticles, copper nanoparticles, zinc oxide nanoparticles, ITO nanoparticles, and gold nanoparticles).

A host material can have a variety of shapes and sizes, can be transparent, translucent, or opaque, can be flexible, bendable, foldable or rigid, can be electromagnetically opaque or electromagnetically transparent, and can be electrically conductive, semiconducting, or insulating. The host material can be in the form of a layer, a film, or a sheet serving as a substrate, or can be in the form of a coating or multiple coatings disposed on top of a substrate or another material. Examples of suitable host materials include ceramics, such as dielectric or non-conductive ceramics (e.g., $SiO_2$-based glass; $SiO_x$-based glass; $TiO_x$-based glass; other titanium, cerium, magnesium analogues of $SiO_x$-based glass; spin-on glass; glass formed from sol-gel processing, silane precursor, siloxane precursor, silicate precursor, tetraethyl orthosilicate, silane, siloxane, phosphosilicates, spin-on glass, silicates, sodium silicate, potassium silicate, a glass precursor, a ceramic precursor, silsesquioxane, metallasilsesquioxanes, polyhedral oligomeric silsesquioxanes, halosilane, sol-gel, silicon-oxygen hydrides, silicones, stannoxanes, silathianes, silazanes, polysilazanes, metallocene, titanocene dichloride, vanadocene dichloride; and other types of glasses), conductive ceramics (e.g., conducting oxides and chalcogenides that are optionally doped and transparent, such as metal oxides and chalcogenides that are optionally doped and transparent), and any combination thereof. Additional examples of suitable host materials include electrically conductive materials and semiconductors listed above as suitable materials for additives. The host material can be, for example, n-doped, p-doped, or un-doped. Further details regarding metal oxides and chalcogenides are set forth the sections below.

In some embodiments, confining additives to a "planar" or "planar-like" embedded region of a host material can lead to decreased topological disorder of the additives and increased occurrence of junction formation between the additives for improved electrical conductivity. Although an embedded region is sometimes referred as "planar," it will be understood that such embedded region is typically not strictly two-dimensional, as the additives themselves are typically three-dimensional. Rather, "planar" can be used in a relative sense, with a relatively thin, slab-like (or layered) local concentration of the additives within a certain region of the host material, and with the additives largely absent from a remainder of the host material. It is noted that the local concentration of additives can be non-planar in the sense that it can be non-flat. For example, the additives can be concentrated in a thin region of the host material that is characterized by curvature with respect to one or more axes, with the additives largely absent from a remainder of the host material. It will also be understood that an embedded region can be referred as "planar," even though such an embedded region can have a thickness that is greater than (e.g., several times greater than) a characteristic dimension of additives. In general, an embedded region can be located adjacent to a side of a host material, adjacent to a middle of the host material, or adjacent to any arbitrary location along a thickness direction of the host material, and multiple embedded regions can be located adjacent to one another or spaced apart from one another within the host material. Each embedded region can include one or more types of additives, and embedded regions (which are located in the same host material) can include different types of additives. In some embodiments, by confining electrically conductive additives to a set of "planar" embedded regions of a host material (as opposed to randomly throughout the host material), a higher electrical conductivity can be achieved for a given amount of the additives per unit of area. Any additives not confined to an embedded region represent an excess amount of additives that can be omitted.

In some embodiments, transparent conductors can have additives embedded or otherwise incorporated into a host material from about 10% (or less, such as from about 0.1%) by volume into an embedding surface and up to about 100% by volume into the embedding surface, and can have the additives exposed at varying surface area coverage, such as from about 0.1% surface area coverage (or less, such as 0% when an embedded region is entirely below the surface, or when the additives are completely encapsulated by the host material) up to about 99.9% (or more) surface area coverage. For example, in terms of a volume of an additive embedded below the embedding surface relative to a total volume of the additive, at least one additive can have an embedded volume percentage (or a population of the additives can have an average embedded volume percentage) in the range of about 0% to about 100%, such as from 10% to about 50%, or from about 50% to about 100%.

Transparent conductors of some embodiments can have an embedded region with a thickness greater than a characteristic dimension of additives used (e.g., for nanowires, greater than a diameter of an individual nanowire or an average diameter across the nanowires), with the additives largely confined to the embedded region with the thickness less than an overall thickness of the host material. For example, the thickness of the embedded region can be no greater than about 80% of the overall thickness of the host material, such as no greater than about 50%, no greater than about 40%, no greater than about 30%, no greater than about 20%, no greater than about 10%, or no greater than about 5% of the overall thickness. In other embodiments, additives can be distributed throughout a larger volume fraction within a host material, such as in the case of bulk incorporation.

In some embodiments, additives can be embedded or otherwise incorporated into a host material by varying degrees relative to a characteristic dimension of the additives used (e.g., for nanowires, relative to a diameter of an individual nanowire or an average diameter across the nanowires). For example, in terms of a distance of a furthest embedded point on an additive below an embedding surface, at least one additive can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As another example, a population of the additives, on average, can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As will be understood, the extent to which additives are embedded into a host material can impact a roughness of an embedding surface, such as when measured as an extent of variation of heights across the embedding surface (e.g., a standard deviation relative to an average height). In some embodiments, a roughness of the surface-embedded structure is less than a characteristic dimension of partially embedded additives.

In some embodiments, at least one additive can extend out from an embedding surface of a host material from about 0.1 nm to about 1 cm, such as from about 1 nm to about 50 nm, from about 50 nm to 100 nm, or from about 100 nm to about 100 microns. In other embodiments, a population of additives, on average, can extend out from an embedding surface of a host material from about 0.1 nm to about 1 cm, such as from about 1 nm to about 50 nm, from about 50 nm to 100 nm, or from about 100 nm to about 100 microns. In other embodiments, substantially all of a surface area of a host material (e.g., an area of an embedding surface) is occupied by additives. In other embodiments, up to about 100% or up to about 75% of the surface area is occupied by additives, such as up to about 50% of the surface area, up to about 25% of the surface area, up to about 10%, up to about 5%, up to about than 3% of the surface area, or up to about 1% of the surface area is occupied by additives. Additives need not extend out from an embedding surface of a host material, and can be localized entirely below the embedding surface The degree of embedding and surface coverage of additives for a surface-embedded structure can be selected in accordance with a particular application.

In some embodiments, if nanowires are used as additives, characteristics that can influence electrical conductivity and other desirable characteristics include, for example, nanowire density or loading level, surface area coverage, nanowire length, nanowire diameter, uniformity of the nanowires, material type, stability of the nanowire formulations, wire-wire junction resistance, host-material resistance, nanowire conductivity, crystallinity of the nanowire, and purity. There can be a preference for nanowires with a low junction resistance and a low bulk resistance in some embodiments. For attaining higher electrical conductivity while maintaining high transparency, thinner diameter, longer length nanowires can be used (e.g., with relatively large aspect ratios to facilitate nanowire junction formation and in the range of about 50 to about 2,000, such as from about 50 to about 1,000, or from about 100 to about 800), and metallic nanowires, such as silver, copper, and gold nanowires, can be used. In other embodiments, if the nanowires are thin, their bulk conductivity can decrease because of the small cross-sectional area of the wires; therefore, in some embodiments, thicker diameter wires can be selected. Using nanowires as additives to form nanowire networks, such as silver nanowire networks, can be desirable for some embodiments. Other metallic nanowires, non-metallic nanowires, such as ITO and other oxide and chalcogenide nanowires, also can be used. Additives composed of semiconductors with bandgaps outside the visible optical spectrum energies (e.g., <1.8 eV and >3.1 eV) or approximately near this range, can be used to create transparent conductors with high optical transparency in that visible light will typically not be absorbed by the bandgap energies or by interfacial traps therein. Various dopants can be used to tune the conductivity of these aforementioned semiconductors, taking into account the shifted Fermi levels and bandgap edges via the Moss-Burstein effect. The nanowires can be largely uniform or monodisperse in terms of dimensions (e.g., diameter and length), such as the same within about 5% (e.g., a standard deviation relative to an average diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanowires can be, for example, up to about 100%, less than about 100%, up to about 75%, up to about 50%, up to about 25%, up to about 10%, up to about 5%, up to about 3%, or up to about 1%. Silver nanowires can be particularly desirable for certain embodiments, since silver oxide, which can form (or can be formed) on surfaces of the nanowires as a result of oxidation, is electrically conductive. Also, core-shell nanowires (e.g., silver core with gold or platinum shell) also can decrease junction resistance.

In some embodiments, if nanotubes are used as additives (whether formed of carbon, a metal, a metal alloy, a metal oxide, or another material), characteristics that can influence electrical conductivity and other desirable characteristics include, for example, nanotube density or loading level, surface area coverage, nanotube length, nanotube inner diameter, nanotube outer diameter, whether single-walled or multi-walled nanotubes are used, uniformity of the nanotubes, material type, and purity. There can be a preference for nanotubes with a low junction resistance in some embodiments. For reduced scattering in the context of certain devices such as displays, nanotubes, such as carbon nanotubes, can be used to form nanotube networks. Alternatively, or in combination, smaller diameter nanowires can be used to achieve a similar reduction in scattering relative to the use of nanotubes. Nanotubes can be largely uniform or monodisperse in terms of dimensions (e.g., outer diameter, inner diameter, and length), such as the same within about 5% (e.g., a standard deviation relative to an average outer/inner diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanotubes can be, for example, up to about 100%, less than about 100%, up to about 75%, up to about 50%, up to about 25%, up to about 10%, up to about 5%, up to about 3%, or up to about 1%.

It should be understood that the number of additive types can be varied for a given device or application. For example, any, or a combination, of silver nanowires, copper nanowires, and gold nanowires can be used along with ITO nanoparticles to yield high optical transparency and high electrical conductivity. Similar combinations include, for example, any, or a combination, of silver nanowires, copper nanowires, and gold nanowires along with any one or more of ITO nanowires, ZnO nanowires, ZnO nanoparticles, silver nanoparticles, gold nanoparticles, SWNTs, MWNTs, fullerene-based materials (e.g., carbon nanotubes and buckyballs), and ITO nanoparticles. The use of ITO nanoparticles, nanowires, or layers of conductive oxides or ceramics (e.g., ITO, aluminum-doped zinc oxide, or other types of doped or undoped zinc oxides) can provide additional functionality, such as by serving as a buffer layer to adjust a work function in the context of function of a transparent electrode for use in a solar device, a thin-film solar device, an OLED display type device, an OLED lighting type device, or similar device to provide a conductive path for the flow of an electric current, in place of, or in combination with, a conductive path provided by other additives.

In some embodiments, additives are initially provided as discrete objects. Upon embedding or incorporation into a host material, the host material can envelop or surround the additives such that the additives become aligned or otherwise arranged within a "planar" or "planar-like" embedded region. In some embodiments for the case of additives such as nanowires, nanotubes, microwires, microtubes, or other additives with an aspect ratio greater than 1, the additives become aligned such that their lengthwise or longitudinal axes are largely confined to within a range of angles relative to a horizontal plane, or another plane corresponding, or parallel, to a plane of an embedding surface. For example, the additives can be elongated and can be aligned such that their lengthwise or longest-dimension axes, on average, are confined to a range from about −45° to about +45° relative to the horizontal plane, such as from about −35° to about +35°, from about −25° to about +25°, from about −15° to about +15°, from about −5° to about +5°, from about −1° to about +1°, from about −0.1° to about +0.1°, or from about −0.01° to about +0.01°. Stated in another way, lengthwise axes of the additives can be confined such that $\theta < SIN^{-1}(t/L)$, where L=length of an additive, t=thickness of the host material, and θ is an angle relative to a horizontal plane corresponding to the embedding surface. In this example, little or substantially none of the additives can have their lengthwise or longitudinal axes oriented outside of the range from about −45° to about 45° relative to the horizontal plane. Within the embedded region, neighboring additives can contact one another in some embodiments. Such contact can be improved using longer aspect ratio additives, while maintaining a relatively low surface area coverage for desired transparency. In some embodiments, contact between additives, such as nanowires, nanoparticles, microwires, and microparticles, can be increased through sintering or annealing, such as low temperature sintering at temperatures of about 50° C., about 125° C., about 150° C., about 175° C., or about 200° C., or in the range of about 50° C. to about 125° C., about 100° C. to about 125° C., about 125° C. to about 150° C., about 150° C. to about 175° C., or about 175° C. to about 200° C., flash sintering, sintering through the use of redox reactions to cause deposits onto additives to grow and fuse the additives together, or any combination thereof. For example, in the case of silver or gold additives, silver ions or gold ions can be deposited onto the additives to cause the additives to fuse with neighboring additives. High temperature sintering at temperatures at or above about 200° C. is also contemplated. It is also contemplated that little or no contact is needed for certain applications and devices, where charge tunneling or hopping provides sufficient electrical conductivity in the absence of actual contact, or where a host material or a coating on top of the host material may itself be electrically conductive or semiconducting. Such applications and devices can operate with a sheet resistance up to about $10^6$ Ω/sq or more. Individual additives can be separated by electrical and quantum barriers for electron transfer.

Transparent conductors described herein can be quite durable. In some embodiments, such durability is in combination with rigidity and robustness, and, in other embodiments, such durability is in combination with the ability to be flexed, rolled, bent, and folded, amongst other physical actions, with, for example, no greater than about 50%, no greater than about 40%, no greater than about 30%, no greater than about 20%, no greater than about 15%, no greater than about 10%, no greater than about 5%, no greater than about 3%, or substantially no decrease in transmittance, and no greater than about 50%, no greater than about 40%, no greater than about 30%, no greater than about 20%, no greater than about 15%, no greater than about 10%, no greater than about 5%, no greater than about 3%, or substantially no increase in resistance (e.g., sheet resistance). In some embodiments, the transparent conductors can survive a standard test for adhesion of coatings (e.g., a Scotch Tape Test) used in the coatings industry and yield substantially no decrease, or no greater than about 5% decrease, no greater than about 10% decrease, no greater than about 15% decrease, no greater than about 20% decrease, no greater than about 30% decrease, no greater than about 40% decrease, or no greater than about 50% decrease in observed transmittance, and yield substantially no increase, or no greater than about 5% increase, no greater than about 10% increase, no greater than about 15% increase, no greater than about 20% increase, no greater than about 30% increase, no greater than about 40% increase, or no greater than about 50% increase in observed resistance (e.g., sheet resistance). In some embodiments, the transparent conductors can also survive rubbing, scratching, flexing, physical abrasion, thermal cycling (e.g., exposure to temperatures up to (or at least) about 600° C., up to (or at least) about 550° C., up to (or at least) about 500° C., up to (or at least) about 450° C., or up to (or at least) about 400° C.), chemical exposure, accelerated life test ("ALT"), and humidity cycling with substantially no decrease, no greater than about 50% decrease, no greater than about 40% decrease, no greater than about 30% decrease, no greater than about 20% decrease, no greater than about 15% decrease, no greater than about 10% decrease, no greater than about 5% decrease, or no greater than about 3% decrease in observed transmittance, and with substantially no increase, no greater than about 50% increase, no greater than about 40% increase, no greater than about 30% increase, no greater than about 20% increase, no greater than about 15% increase, no greater than about 10% increase, no greater than about 5% increase, or no greater than about 3% increase in observed resistance (e.g., sheet resistance). This enhanced durability can result from embedding or incorporation of additives within a host material, such that the additives are physically or chemically held inside the host material by molecular chains or other components of the host material. In some cases, flexing or pressing can be observed to increase conductivity.

Various standard tests can be used to measure durability, such as in terms of abrasion resistance. One such test, among others, is ASTM-F735-06 Standard Test Method for Abrasion Resistance of Transparent Plastics and Coatings Using the Oscillating Sand Method. Another test that can be used is ASTM D1044-08 Standard Test Method for Resistance of Transparent Plastics to Surface Abrasion. Yet another possible standard test is ASTM D4060-10 Standard Test Method for Abrasion Resistance of Organic Coatings by the Taber Abraser. Additional standard tests that can be used include tests for hardness, such as ASTM D3363-05(2011)e1 Standard Test Method for Film Hardness by Pencil Test, ASTM E384, ASTM E10, ASTM B277-95 Standard Test Method for Hardness of Electrical Contact Materials, and ASTM D2583-06 Standard Test Method for Indentation Hardness of Rigid Plastics by Means of a Barcol Impressor. Further details on these tests are available from ASTM International of West Conshohocken, Pa. Other standardized protocols include the ISO 15184, ES K-5600. ECCA-T4-1 BS 3900-E19, SNV 37113. SIS 184187, NCN 5350, and MIL C 27 227.

Another set of tests can be used to measure and evaluate reliability under ALT conditions. Some industry standards include dry heat (e.g., 85° C./dry), moist heat (e.g., 60° C./90% RH, or 85° C./85° RH), dry cold (e.g., −30° C./dry), thermal shock (e.g., 80° C. ←→40° C. cycle for 30 minutes each). These ALT conditions can be carried out over hours, days, weeks, or months with samples exposed to those conditions for extended periods of time or number of cycles. In certain embodiments of the transparent conductors disclosed herein, the change in sheet resistance, transparency, and/or haze are controlled within +/−50%, in other cases, +/−25%, in other cases, +/−10%, and in other cases, +/−5%, or lower.

Another aspect of some embodiments of transparent conductors is that an electrical percolation threshold can be attained using a lesser amount of additives. Stated in another way, electrical conductivity can be attained using less additive material, thereby saving additive material and associated cost and increasing transparency. As will be understood, an electrical percolation threshold is typically reached when a sufficient amount of additives is present to allow percolation of electrical charge from one additive to another additive, thereby providing a conductive path across at least portion of a network of additives. In some embodiments, an electrical percolation threshold can be observed via a change in slope of a logarithmic plot of resistance versus loading level of additives. A lesser amount of additive material can be used since additives are largely confined to a "planar" or "planar-like" embedded region in some embodiments, thereby greatly reducing topological disorder and resulting in a higher probability of inter-additive (e.g., inter-nanowire or inter-nanotube) junction formation. In other words, because the additives are confined to a thin embedded region in the host material, as opposed to dispersed throughout the thickness of the host material, the probability that the additives will interconnect and form junctions can be greatly increased. A lesser amount of additive material also can be used in embodiments where a host material is itself electrically conductive or semiconducting. In some embodiments, an electrical percolation threshold can be attained at a loading level of additives in the range of about 0.001 $\mu g/cm^2$ to about 100 $\mu g/cm^2$ (or higher), such as from about 0.01 $\mu g/cm^2$ to about 100 $\mu g/cm^2$, from about 10 $\mu g/cm^2$ to about 100 $\mu g/cm^2$, from 0.01 $\mu g/cm^2$ to about 0.4 $\mu g/cm^2$, from about 0.5 $\mu g/cm^2$ to about 5 $\mu g/cm^2$, or from about 0.8 $\mu g/cm^2$ to about 3 $\mu g/cm^2$ for certain additives such as silver nanowires. These loading levels can be varied according to dimensions, material type, spatial dispersion, and other characteristics of additives.

In addition, a lesser amount of additives can be used (e.g., as evidenced by a thickness of an embedded region) to achieve a network-to-bulk transition, which is a parameter representing a transition of a thin layer from exhibiting effective material properties of a sparse two-dimensional conducting network to one exhibiting effective properties of a three-dimensional conducting bulk material. By confining additives to a "planar" or "planar-like" embedded region, a lower sheet resistance can be attained at specific levels of solar flux-weighted transmittance. Furthermore, in some embodiments, carrier recombination can be reduced due to the reduction or elimination of interfacial defects associated with a separate coating or other secondary material into which additives are mixed.

To expound further on these advantages, a network of additives can be characterized by a topological disorder and by contact resistance. Topologically, above a critical density of additives and above a critical density of additive-additive (e.g., nanowire-nanowire, nanotube-nanotube, or nanotube-nanowire) junctions, electrical current can readily flow from a source to a drain. A "planar" or "planar-like" network of additives can reach a network-to-bulk transition with a reduced thickness, represented in terms of a characteristic dimension of the additives (e.g., for nanowires, relative to a diameter of an individual nanowire or an average diameter across the nanowires). For example, an embedded region can have a thickness up to about 10 times (or more) the characteristic dimension, such as up to about 9 times, up to about 8 times, up to about 7 times, up to about 6 times, up to about 5 times, up to about 4 times, up to about 3 times, or up to about 2 times the characteristic dimension, and down to about 0.05, about 0.1, about 0.2, about 0.3, about 0.4, or about 0.5 times the characteristic dimension, allowing devices to be thinner while increasing optical transparency and electrical conductivity. Accordingly, the transparent conductors described herein provide, in some embodiments, an embedded region with a thickness up to about n×d (in terms of nm) within which are localized additives having a characteristic dimension of d (in terms of nm), where n=2, 3, 4, 5, or higher.

Another advantage of some embodiments of transparent conductors is that, for a given level of electrical conductivity, the transparent conductors can yield higher transparency. This is because less additive material can be used to attain that level of electrical conductivity, in view of the efficient formation of additive-additive junctions for a given loading level of additives, in view of the use of a host material that is itself electrically conductive or semiconducting, or both. As will be understood, a transmittance of a thin conducting material (e.g., in the form of a film) can be expressed as a function of its sheet resistance $R_\square$ and an optical wavelength, as given by the following approximate relation for a thin film:

$$T(\lambda) = \left(1 + \frac{188.5}{R_\square}\frac{\sigma_{Op}(\lambda)}{\sigma_{DC}}\right)^{-2}$$

where $\sigma_{Op}$ and $\sigma_{DC}$ are the optical and DC conductivities of the material, respectively. In some embodiments, silver nanowire networks surface-embedded or otherwise incorporated into flexible transparent substrates can have sheet resistances as low as about 3.2 Ω/sq or about 0.2 Ω/sq, or even lower. In other embodiments, transparent conductors suitable for solar devices can reach up to about 85% (or more) for solar flux-weighted transmittance $T_{solar}$ and a sheet resistances as low as about 20 Ω/sq (or below). In still other embodiments, a sheet resistance of ≦10 Ω/sq at ≧85% (e.g., at least about 85%, at least about 90%, or at least about 95%, and up to about 97%, about 98%, or more) solar flux-weighted transmittance can be obtained with the transparent conductors. It will be understood that transmittance can be measured relative to other ranges of optical wavelength, such as transmittance at a given wavelength of 550 nm, a human vision or photometric-weighted transmittance (e.g., from about 350 nm to about 700 nm), solar-flux weighted transmittance, transmittance at a given wavelength or range of wavelengths in the infrared range, and transmittance at a given wavelength or range of wavelengths in the ultraviolet range. It will also be understood that transmittance can be measured relative to a substrate (if present) (e.g., the transmittance valued would not include the transmittance loss from an underlying substrate that is below a host material that includes additives), or can be measured relative to air (e.g., the transmittance value would include the transmittance loss from an underlying substrate). Unless otherwise specified herein, transmittance values are designated relative to a substrate (if present), although similar transmittance values (albeit with somewhat higher values) are also contemplated when measured relative to air. For some embodiments, a DC-to-optical conductivity ratio of surface-embedded structures can be at least about 100, at least about 115, at least about 300, at least about 400, or at least about 500, and up to about 600, up to about 800, or more.

Certain transparent conductors can include additives of nanowires (e.g., silver nanowires) of average diameter in the range of about 1 nm to about 100 nm, about 10 nm to about 80 nm, about 20 nm to about 80 nm, or about 40 nm to about 60 nm, and an average length in the range of about 50 nm to about 1,000 µm, about 50 nm to about 500 µm, about 100 nm to about 100 µm, about 500 nm to 50 µm, about 5 µm to about 50 µm, about 20 µm to about 150 µm, about 5 µm to about 35 µm, about 25 µm to about 80 µm, about 25 µm to about 50 µm, or about 25 µm to about 40 µm. A top of an embedded region can be located about 0 nm to about 100 µm below a top, embedding surface of a host material, such as about 0.0001 nm to about 100 µm below the embedding surface, about 0.01 nm to about 100 µm below the embedding surface, about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanowires embedded or incorporated into a host material can protrude from an embedding surface from about 0% by volume and up to about 90%, up to about 95%, or up to about 99% by volume. For example, in terms of a volume of a nanowire exposed above the embedding surface relative to a total volume of the nanowire, at least one nanowire can have an exposed volume percentage (or a population of the nanowires can have an average exposed volume percentage) of up to about 1%, up to about 5%, up to about 20%, up to about 50%, or up to about 75% or about 95%. At a transmittance of about 85% or greater (e.g., solar flux-weighted transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or about 0.1 Ω/sq, or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or less.

Certain transparent conductors can include additives of nanotubes (e.g., either, or both, MWCNT and SWCNT) of average outer diameter in the range of about 1 nm to about 100 nm, about 1 nm to about 10 nm, about 10 nm to about 50 nm, about 10 nm to about 80 nm, about 20 nm to about 80 nm, or about 40 nm to about 60 nm, and an average length in the range of about 50 nm to about 100 µm, about 100 nm to about 100 µm, about 500 nm to 50 µm, about 5 µm to about 50 µm, about 5 µm to about 35 µm, about 25 µm to about 80 µm, about 25 µm to about 50 µm, or about 25 µm to about 40 µm. A top of an embedded region can be located about 0 nm to about 100 µm below a top, embedding surface of a host material, such as about 0.01 nm to about 100 µm below the embedding surface, about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanotubes embedded or incorporated into a host material can protrude from an embedding surface from about 0% by volume and up to about 90%, up to about 95%, or up to about 99% by volume. For example, in terms of a volume of a nanotube exposed above the embedding surface relative to a total volume of the nanotube (e.g., as defined relative to an outer diameter of a nanotube), at least one nanotube can have an exposed volume percentage (or a population of the nanotubes can have an average exposed volume percentage) of up to about 1%, up to about 5%, up to about 20%, up to about 50%, or up to about 75% or about 95%. At a transmittance of about 85% or greater (e.g., solar flux-weighted transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 20 Ω/sq, no greater than about 15 Ω/sq, no greater than about 10 Ω/sq, and down to about 1 Ω/sq or about 0.1 Ω/sq, or less.

Incorporation of Additives into Ceramics

Certain embodiments of transparent conductors include ceramics that incorporate additives, such as by surface embedding the ceramics with nanowires, nanotubes, or both. Some industries, such as the solar industry, specify that transparent conductors should withstand processing temperatures as high as about 600° C. In the case of silver nanowires, for example, exposing the silver nanowires to high temperatures can cause their decomposition into silver nanoparticles, disintegration, degradation, or other detrimental effect, thereby potentially losing an electrical percolation network. Advantageously, embedding or incorporating silver nanowires or other types of electrically conductive or semiconducting additives into ceramics can protect the additives from decomposition, thereby maintaining desired levels of electrical conductivity even when exposed to high temperatures. In some embodiments, transparent conductors can be exposed to temperatures up to (or at least) about 600° C., up to (or at least) about 550° C., up to (or at least) about 500° C., up to (or at least) about 450° C., or up to (or at least) about 400° C., with substantially no decrease, no greater than about 3% decrease, no greater than about 5% decrease, no greater than about 10% decrease, no greater than about 15% decrease, no greater than about 20% decrease, no greater than about 30% decrease, no greater than about 40% decrease, or no greater than about 50% decrease in observed transmittance, and with substantially no increase, no greater than about 100% increase, no greater than about 50% increase, no greater than about 40% increase, no greater than about 30% increase, no greater than about 20% increase, no greater than about 15% increase, no greater than about 10% increase, no greater than about 5% increase, or no greater than about 3% increase in observed resistance (e.g., sheet resistance).

Figure 1B:
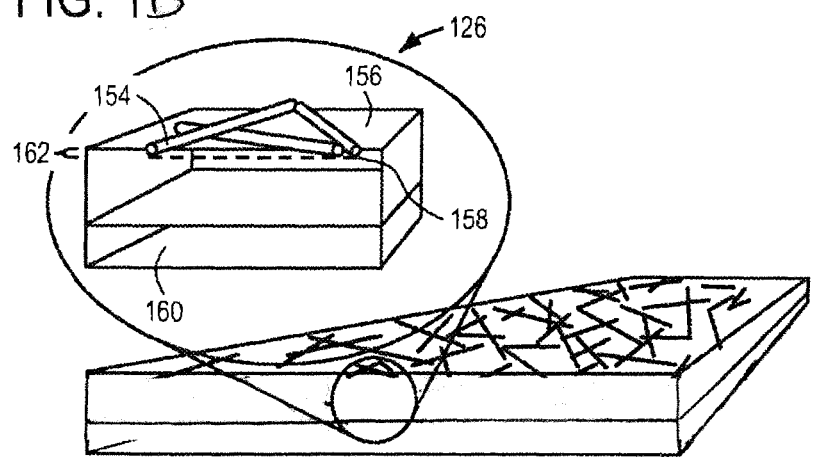

FIG. 1A and FIG. 1B illustrate examples of transparent conductors 120 and 126 implemented in accordance with embodiments of the invention. Specifically, FIG. 1A is a schematic of surface-embedded additives 130 that form a network that is partially exposed and partially buried into a top, embedding surface 134 of a host material 132, which corresponds to a ceramic in the form of a substrate. The embedding surface 134 also can be a bottom surface of the host material 132. As illustrated in FIG. 1A, the network of the additives 130 is localized adjacent to the embedding surface 134 and within an embedded region 138 of the host material 132, with a remainder of the host material 132 largely devoid of the additives 130. In the illustrated embodiment, the embedded region 138 is relatively thin (e.g., having a thickness less than or much less than an overall thickness of the host material 132, or having a thickness comparable to a characteristic dimension of the additives 130), and, therefore, can be referred to as "planar" or "planar-like." Through embedding into the host material 132, the additives 130 are protected from decomposition when exposed to high temperatures, thereby maintaining desired levels of electrical conductivity.

FIG. 1B is a schematic of surface-embedded additives 154 that form a network that is partially exposed and partially buried into a top, embedding surface 156 of a host material 158, which corresponds to a ceramic in the form of a coating or other secondary material that is disposed on top of a substrate 160. As illustrated in FIG. 1B, the network of the additives 154 can be localized adjacent to the embedding surface 156 and within an embedded region 162 of the host material 158, with a remainder of the host material 158 largely devoid of the additives 154. It is also contemplated that the additives 154 can be distributed throughout a larger volume fraction within the host material 158, such as in the case of a relatively thin coating having a thickness comparable to a characteristic dimension of the additives 154. In the illustrated embodiment, the embedded region 162 is relatively thin, and, therefore, can be referred to as "planar" or "planar-like." Through at least partial embedding into the host material 158, the additives 154 are protected from decomposition when exposed to high temperatures, thereby maintaining desired levels of electrical conductivity.

In some embodiments, additives can be exposed at the surface, while, in other embodiments, the additives can be completely beneath the surface (e.g., an embedded region is entirely below the embedding surface). In some cases, when the additives are completely beneath the surface, a transparent conductor can still exhibit surface conductivity due to a ceramic layer being thin enough to allow tunneling, being semiconducting, being conducting, or a combination thereof.

The transparent conductors 120 and 126 as well as certain other transparent conductors described herein can be formed according to manufacturing methods that can be carried out in a highly-scalable, rapid, and low-cost fashion, in which additives are durably incorporated into a wide variety of host materials. Some embodiments of the manufacturing methods can be generally classified into two categories: (1) surface-embedding additives into a dry composition to yield a host material with the surface-embedded additives; and (2) surface-embedding additives into a wet composition to yield a host material with the surface-embedded additives. It will be understood that such classification is for ease of presentation, and that "dry" and "wet" can be viewed as relative terms (e.g., with varying degrees of dryness or wetness), and that the manufacturing methods can apply to a continuum spanned between fully "dry" and fully "wet." Accordingly, processing conditions and materials described with respect to one category (e.g., dry composition) can also apply with respect to another category (e.g., wet composition), and vice versa. It will also be understood that hybrids or combinations of the two categories are contemplated, such as where a wet composition is dried or otherwise converted into a dry composition, followed by surface-embedding of additives into the dry composition to yield a host material with the surface-embedded additives. It will further be understood that, although "dry" and "wet" sometimes may refer to a level of water content or a level of solvent content, "dry" and "wet" also may refer to another characteristic of a composition in other instances, such as a degree of cross-linking or polymerization.

Figure 2A:
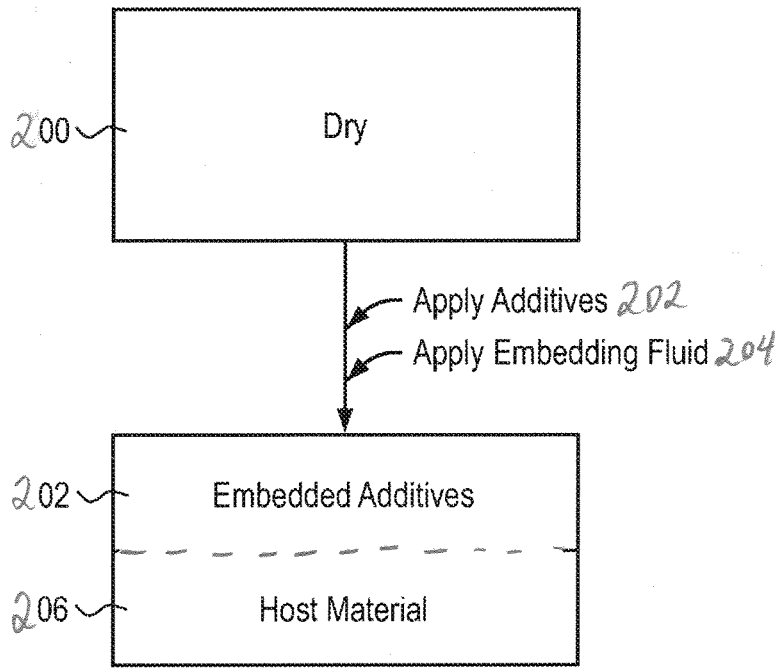
FIG. 2A through FIG. 2C illustrate manufacturing methods to form transparent conductors, according to embodiments of the invention.
Figure 2B:
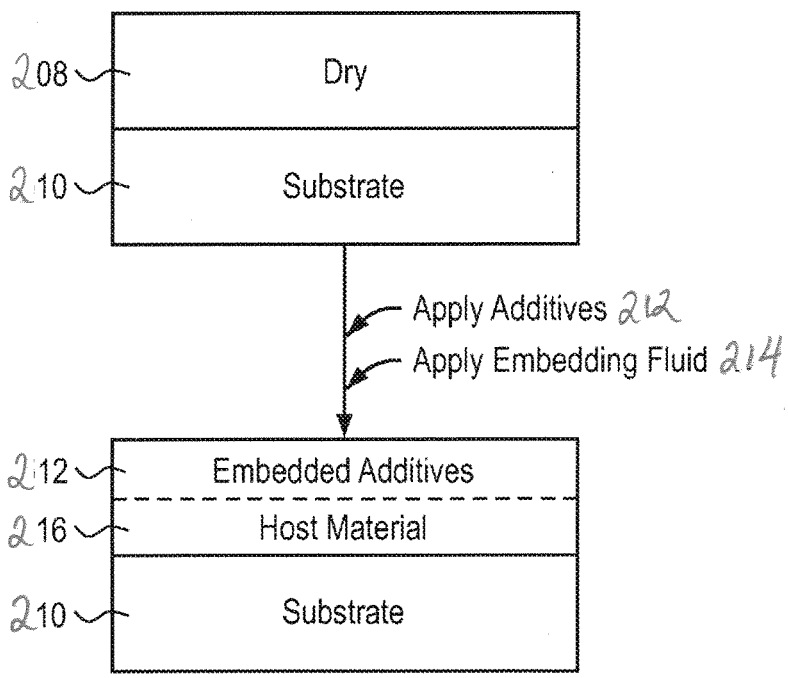

Attention first turns to FIG. 2A and FIG. 2B, which illustrate examples of manufacturing methods for surface-embedding additives into dry compositions, according to embodiments of the invention.

By way of overview, the illustrated embodiments involve the application of an embedding fluid to allow additives to be embedded into a dry composition, such as one including a ceramic, a ceramic precursor, or a combination thereof. In general, the embedding fluid serves to reversibly alter the state of the dry composition, such as by dissolving, reacting, softening, solvating, swelling, or any combination thereof, thereby facilitating embedding of the additives into the dry composition. For example, the dry composition can include a ceramic or a ceramic precursor in the form of a gel or a semisolid, and application of the embedding fluid can cause the gel to be swollen by filling pores with the fluid, by elongation of partially uncondensed oligomeric or polymeric chains, or both. As a further example, the dry composition can include a ceramic or a ceramic precursor in the form of an ionic polymer, such as sodium silicate or another alkali metal silicate, and application of the embedding fluid can dissolve at least a portion of the ionic polymer to allow embedding of the additives. The embedding of the additives is then followed by hardening or other change in state of the softened or swelled composition, resulting in a host material having the additives embedded therein. For example, the softened or swelled composition can be hardened by exposure to ambient conditions, or by cooling the softened or swelled composition. In other embodiments, the softened or swelled composition is hardened by evaporating or otherwise removing at least a portion of the embedding fluid (or other liquid or liquid phase that is present), applying airflow, applying a vacuum, or any combination thereof. In the case of a ceramic precursor, curing can be carried out after embedding such that the ceramic precursor is converted into a glass or another ceramic. Curing can be omitted, depending on the particular application. Depending on the particular ceramic precursor (e.g., a silane), more or less heat can be involved to achieve various degrees of curing or conversion into a fully reacted or fully formed glass.

Referring to FIG. 2A, a dry composition 200 can be provided in the form of a sheet, a film, or other suitable form. The dry composition 200 can correspond to a host material and, in particular, can include any material previously listed as suitable host materials, such as a ceramic. It is also contemplated that the dry composition 200 can correspond to a host material precursor, which can be converted into the host material by suitable processing, such as drying, curing, cross-linking, polymerizing, or any combination thereof. In some embodiments, the dry composition 200 can include a material with a solid phase as well as a liquid phase, or can include a material that is at least partially solid or has properties resembling those of a solid, such as a semisolid, a gel, and the like. Next, and referring to FIG. 2A, additives 202 and an embedding fluid 204 are applied to the dry composition 200. The additives 202 can be in solution or otherwise dispersed in the embedding fluid 204, and can be simultaneously applied to the dry composition 200 via one-step embedding. Alternatively, the additives 202 can be separately applied to the dry composition 200 before, during, or after the embedding fluid 204 treats the dry composition 200. The separate application of the additives 202 can be referred as two-step embedding. Subsequently, the resulting host material 206 has at least some of the additives 502 partially or fully embedded into a surface of the host material 206. Optionally, suitable processing can be carried out to convert the softened or swelled composition 200 into the host material 206. During device assembly, the host material 206 with the embedded additives 202 can be laminated or otherwise connected to adjacent device layers, or can serve as a substrate onto which adjacent device layers are formed, laminated, or otherwise applied.

FIG. 2B is a process flow similar to FIG. 2A, but with a dry composition 208 provided in the form of a coating that is disposed on top of a substrate 210. The dry composition 208 can correspond to a host material, or can correspond to a host material precursor, which can be converted into the host material by suitable processing, such as drying, curing, cross-linking, polymerizing, or any combination thereof. Other characteristics of the dry composition 208 can be similar to those described above with reference to FIG. 2A, and are not repeated below. Referring to FIG. 2B, the substrate 210 can be transparent or opaque, can be flexible or rigid, and can be comprised of, for example, a polymer, an ionomer, a coated polymer (e.g., a PET film with a PMMA hardcoat), ethylene vinyl acetate (or EVA), cyclic olefin polymer (or COP), cyclic olefin copolymer (or COC), polyvinyl butyral (or PVB), thermoplastic olefin (or TPO), thermoplastic polyurethane (or TPU), polyethylene (or PE), polyethylene terephthalate (or PET), polyethylene terephthalate glycol (or PETG), polycarbonate, polyvinyl chloride (or PVC), polypropylene (or PP), acrylic-based polymer, acrylonitrile butadiene styrene (or ABS), ceramic, glass, silicon, metal (e.g., stainless steel or aluminum), or any combination thereof, as well as any other material previously listed as suitable host materials. The substrate 210 can serve as a temporary substrate that is subsequently removed during device assembly, or can be retained in a resulting device as a layer or other component of the device. Next, additives 212 and an embedding fluid 214 are applied to the dry composition 208. The additives 212 can be in solution or otherwise dispersed in the embedding fluid 214, and can be simultaneously applied to the dry composition 208 via one-step embedding. Alternatively, the additives 212 can be separately applied to the dry composition 208 before, during, or after the embedding fluid 214 treats the dry composition 208. As noted above, the separate application of the additives 212 can be referred as two-step embedding. Subsequently, the resulting host material 216 (which is disposed on top of the substrate 210) has at least some of the additives 212 partially or fully embedded into a surface of the host material 216. Optionally, suitable processing can be carried out to convert the softened or swelled composition 208 into the host material 216. During device assembly, the host material 216 with the embedded additives 212 can be laminated or otherwise connected to adjacent device layers, or can serve as a substrate onto which adjacent device layers are formed, laminated, or otherwise applied.

In some embodiments, additives are dispersed in an embedding fluid, or dispersed in a separate carrier fluid and separately applied to a dry composition. Dispersion can be accomplished by mixing, milling, sonicating, shaking (e.g., wrist action shaking, rotary shaking), vortexing, vibrating, flowing, chemically modifying the additives' surfaces, chemically modifying a fluid, increasing the viscosity of the fluid, adding a dispersing or suspending agent to the fluid, adding a stabilization agent to the fluid, changing the polarity of the fluid, changing the hydrogen bonding of the fluid, changing the pH of the fluid, or otherwise processing the additives to achieve the desired dispersion. The dispersion can be uniform or non-uniform, and can be stable or unstable. A carrier fluid can serve as an embedding fluid (e.g., an additional embedding fluid), or can have similar characteristics as an embedding fluid. In other embodiments, a carrier fluid can serve as a transport medium to carry or convey additives, but is otherwise substantially inert towards the additives and the dry composition.

Fluids (e.g., embedding fluids and carrier fluids) can include liquids, gases, or supercritical fluids. Combinations of different types of fluids are also suitable. Fluids can include one or more solvents. For example, a fluid can include water, an ionic or ion-containing solution, an ionic liquid, an organic solvent (e.g., a polar, organic solvent; a non-polar, organic solvent; an aprotic solvent; a protic solvent; a polar aprotic solvent, or a polar, protic solvent); an inorganic solvent, or any combination thereof. Oils also can be considered suitable fluids. Salts, surfactants, dispersants, stabilizers, polymers, monomers, oligomers, cross-linking agents, polymerization agents, acids, bases, or binders can also be included in the fluids.

Examples of suitable organic solvents include 2-methyltetrahydrofuran, a chloro-hydrocarbon, a fluoro-hydrocarbon, a ketone, a paraffin, acetaldehyde, acetic acid, acetic anhydride, acetone, acetonitrile, an alkyne, an olefin, aniline, benzene, benzonitrile, benzyl alcohol, benzyl ether, butanol, butanone, butyl acetate, butyl ether, butyl formate, butyraldehyde, butyric acid, butyronitrile, carbon disulfide, carbon tetrachloride, chlorobenzene, chlorobutane, chloroform, cycloaliphatic hydrocarbons, cyclohexane, cyclohexanol, cyclohexanone, cyclopentanone, cyclopentyl methyl ether, diacetone alcohol, dichloroethane, dichloromethane, diethyl carbonate, diethyl ether, diethylene glycol, diglyme, di-isopropylamine, dimethoxyethane, dimethyl formamide, dimethyl sulfoxide, dimethylamine, dimethylbutane, dimethylether, dimethylformamide, dimethylpentane, dimethylsulfoxide, dioxane, dodecafluoro-1-hepatanol, ethanol, ethyl acetate, ethyl ether, ethyl formate, ethyl propionate, ethylene dichloride, ethylene glycol, formamide, formic acid, glycerine, heptane, hexafluoroisopropanol (or HFIP), hexamethylphosphoramide, hexamethyl phosphorous triamide, hexane, hexanone, hydrogen peroxide, hypochlorite, i-butyl acetate, i-butyl alcohol, i-butyl formate, i-butylamine, i-octane, i-propyl acetate, i-propyl ether, isopropanol, isopropylamine, ketone peroxide, methanol and calcium chloride solution, methanol, methoxyethanol, methyl acetate, methyl ethyl ketone (or MEK), methyl formate, methyl n-butyrate, methyl n-propyl ketone, methyl t-butyl ether, methylene chloride, methylene, methylhexane, methylpentane, mineral oil, m-xylene, n-butanol, n-decane, n-hexane, nitrobenzene, nitroethane, nitromethane, nitropropane, 2-N-methyl-2-pyrrolidinone, n-propanol, octafluoro-1-pentanol, octane, pentane, pentanone, petroleum ether, phenol, propanol, propionaldehyde, propionic acid, propionitrile, propyl acetate, propyl ether, propyl formate, propylamine, propylene glycol, p-xylene, pyridine, pyrrolidine, t-butanol, t-butyl alcohol, t-butyl methyl ether, tetrachloroethane, tetrafluoropropanol (or TFP), tetrahydrofuran (or THF), tetrahydronaphthalene, toluene, triethyl amine, trifluoroacetic acid, trifluoroethanol (or TFE), trifluoropropanol, trimethylbutane, trimethylhexane, trimethylpentane, valeronitrile, xylene, xylenol, or any combination thereof. Alcohols including from one to ten carbon atoms (i.e., $C_1$-$C_{10}$ alcohols, such as $C_1$-$C_6$ alcohols) can be considered suitable, such as methanol, ethanol, 1-propanol, 2-propanol, 1-butanol, 2-butanol, 2-methyl-1-propanol, 2-methyl-2-propanol, 1-pentanol, 2-pentanol, 3-pentanol, 2-2-dimethyl-1-propanol, 1-hexanol, as well as combinations, functionalized forms, and mixtures thereof with another fluid such as water. Alcohols include primary alcohols (e.g., n-propyl alcohol, isobutyl alcohol), secondary alcohols (e.g., isopropyl alcohol, cyclohexanol), tertiary alcohols (e.g., tert-amyl alcohol), or any combination thereof. Other examples of suitable alcohols include monohydric alcohols (e.g., methanol, ethanol, isopropyl alcohol, butyl alcohol, butanol, pentanol, hexadecan-1-ol, amyl alcohol, cetyl alcohol), polyhydric alcohols (e.g., ethylene glycol, glycerin, Butan-1,2,3,4-tetraol, erythritol, Pentane-1,2,3,4,5-pentol, xylitol, Hexane-1,2,3,4,5,6-hexyl, mannitol, sorbitol, Heptane-1,2,3,4,5,6,7-heptol, volemitol), unsaturated aliphatic alcohols (e.g., Prop-2-ene-1-ol, allyl alcohol, 3,7-Dimethyloca-2,6-dien-1-ol, Geraniol, prop-2-in-1-ol, propargyl alcohol), alicyclic alcohols (e.g., cyclohexane-1,2,3,4,5,6-hexyl, inositol, 2-(2-propyl)-5-methyl-cyclohexane-1-ol, Menthol), as well as combinations, functionalized forms, and mixtures thereof with other fluids (e.g., water).

Suitable inorganic solvents include, for example, water, ammonia, sodium hydroxide, sulfur dioxide, sulfuryl chloride, sulfuryl chloride fluoride, phosphoryl chloride, phosphorus tribromide, dinitrogen tetroxide, antimony trichloride, bromine pentafluoride, hydrogen fluoride, or any combination thereof.

Suitable ionic solutions include, for example, choline chloride, urea, malonic acid, phenol, glycerol, 1-alkyl-3-methylimidazolium, 1-alkylpyridinium, N-methyl-N-alkylpyrrolidinium, 1-butyl-3-methylimidazolium hexafluorophosphate, ammonium, choline, imidazolium, phosphonium, pyrazolium, pyridinium, pyrrolidnium, sulfonium, 1-ethyl-1-methylpiperidinium methyl carbonate, 4-ethyl-4-methylmorpholinium methyl carbonate, or any combination thereof. Other methylimidazolium solutions can be considered suitable, including 1-ethyl-3-methylimidazolium acetate, 1-butyl-3-methylimidazolium tetrafluoroborate, 1-n-butyl-3-methylimidazolium tetrafluoroborate, 1-butyl-3-methylimidazolium hexafluorophosphate, 1-n-butyl-3-methylimidazoliumhexafluoro phosphate, 1-butyl-3-methylimidazolium 1,1,1-trifluoro-N [(trifluoromethyl)sulfonyl]methanesulfonamide, 1-butyl-3-methylimidazolium bis(trifluoro methylsulfonyl)imide, 1-butyl-3-methylimidazolium bis[(trifluoromethyl)sulfonyl]amide, and 1-butyl-3-methylimidazolium bis[(trifluoromethyl)sulfonyl]imide, or any combination thereof.

Other suitable fluids include halogenated compounds, imides, and amides, such as N-ethyl-N,N-bis(1-methylethyl)-1-heptanaminium bis[(trifluoromethyl)sulfonyl]imide, ethyl heptyl-di-(1-methylethyl)ammonium 1,1,1-trifluoro-N-[(trifluoromethyl)sulfonyl]methane sulfonamide, ethylheptyl-di-(1-methyl ethyl)ammonium bis(trifluoromethylsulfonyl)imide, ethylheptyl-di-(1-methylethyl)ammonium bis[(trifluoromethyl)sulfonyl]amide, or any combination thereof. A fluid can also include ethylheptyl-di-(1-methylethyl)ammonium bis[(trifluoromethyl)sulfonyl]imide, $N_5N_5N$-tributyl-1-octanaminium trifluoromethane sulfonate, tributyloctylammonium triflate, tributyloctylammonium trifluoromethanesulfonate, N,N,N-tributyl-1-hexanaminium bis[(trifluoromethyl)sulfonyl]imide, tributylhexylammonium 1,1,1-trifluoro-N-[(trifluoromethyl)sulfonyl]methanesulfonamide, tributylhexylammonium bis(trifluoromethylsulfonyl)imide, tributylhexylammonium bis[(trifluoromethyl)sulfonyl]amide, tributylhexylammonium bis[(trifluoromethyl)sulfonyl]imide, N,N,N-tributyl-1-heptanaminium bis[(trifluoromethyl)sulfonyl]imide, tributylheptylammonium 1,1,1-trifluoro-N-[(trifluoro methyl)sulfonyl]methanesulfonamide, tributylheptylammonium bis(trifluoromethylsulfonyl)imide; tributylheptylammonium bis[(trifluoromethyl)sulfonyl]amide, tributylheptylammonium bis[(trifluoromethyl)sulfonyl]imide, N,N,N-tributyl-1-octanaminium bis[(trifluoromethyl) sulfonyl] imide, tributyloctylammonium 1,1,1-trifluoro-N-[(trifluoromethyl)sulfonyl]methane sulfonamide, tributyloctylammonium bis(trifluoromethylsulfonyl)imide, tributyloctylammonium bis[(trifluoromethyl)sulfonyl]amide, tributyloctylammonium bis[(trifluoromethyl)sulfonyl]imide, 1-butyl-3-methylimidazolium trifluoroacetate, 1-methyl-1-propylpyrrolidinium 1,1,1-trifluoro-N-[(trifluoromethyl)sulfonyl]methanesulfonamide, 1-methyl-1-propylpyrrolidinium bis(trifluoro methylsulfonyl)imide, 1-methyl-1-propylpyrrolidinium bis[(trifluoromethyl)sulfonyl]amide, 1-methyl-1-propylpyrrolidinium bis[(trifluoromethyl)sulfonyl]imide, 1-butyl-1-methylpyrrolidinium 1,1,1-trifluoro-N-[(trifluoromethyl)sulfonyl]methanesulfonamide, 1-butyl-1-methylpyrrolidinium bis(trifluoromethylsulfonyl)imide, 1-butyl-1-methylpyrrolidinium bis [(trifluoromethyl)sulfonyl]amide, 1-butyl-1-methylpyrrolidinium bis[(trifluoromethyl)sulfonyl]imide, 1-butylpyridinium 1,1,1-trifluoro-N-[(trifluoromethyl)sulfonyl]methanesulfonamide, 1-butylpyridinium bis(trifluoromethylsulfonyl)imide, 1-butylpyridinium bis[(trifluoromethyl) sulfonyl]amide, 1-butylpyridinium bis[(trifluoromethyl)sulfonyl]imide, 1-butyl-3-methyl imidazolium bis(perfluoroethylsulfonyl)imide, butyltrimethylammonium bis(trifluoromethyl sulfonyl) imide, 1-octyl-3-methylimidazolium 1,1,1-trifluoro-N-[(trifluoromethyl)sulfonyl]methanesulfonamide, 1-octyl-3-methylimidazolium bis(trifluoromethylsulfonyl)imide, 1-octyl-3-methylimidazolium bis[(trifluoromethyl)sulfonyl]amide, 1-octyl-3-methylimidazolium bis[(trifluoromethyl)sulfonyl]imide, 1-ethyl-3-methylimidazolium tetrafluoroborate, $N_5N_5N$-trimethyl-1-hexanaminium bis[(trifluoromethyl)sulfonyl]imide, hexyltrimethylammonium 1,1,1-trifluoro-N-[(trifluoromethyl)sulfonyl]methanesulfonamide, hexyltrimethylammonium bis(trifluoromethylsulfonyl)imide, hexyltrimethylammonium bis[(trifluoromethyl)sulfonyl]amide, hexyltrimethylammonium bis[(trifluoromethyl)sulfonyl]imide, N,N,N-trimethyl-1-heptanaminium bis[(trifluoromethyl)sulfonyl]imide, heptyltrimethylammonium 1,1,1-trifluoro-N-[(trifluoromethyl)sulfonyl]methanesulfonamide, heptyltrimethylammonium bis(trifluoro methylsulfonyl)imide, heptyltrimethylammonium bis[(trifluoromethyl)sulfonyl]amide, heptyltrimethylammonium bis[(trifluoromethyl)sulfonyl]imide, N,N,N-trimethyl-1-octanaminium bis[(trifluoromethyl)sulfonyl]imide, trimethyloctylammonium 1,1,1-trifluoro-N-[(trifluoro methyl)sulfonyl]methanesulfonamide, trimethyloctylammonium bis(trifluoromethylsulfonyl)imide, trimethyloctylammonium bis[(trifluoromethyl)sulfonyl]amide, trimethyloctylammonium bis[(trifluoromethyl)sulfonyl]imide, 1-ethyl-3-methylimidazolium ethyl sulfate, or any combination thereof.

Control over surface-embedding of additives can be achieved through the proper balancing of the swelling-dispersion-evaporation-application stages. This balance can be controlled by, for example, a solvent-host material interaction parameter, sizes of additives, reactivity and volatility of an embedding fluid, impinging additive momentum or velocity, temperature, humidity, pressure, and others factors. More particularly, relevant processing parameters for surface-embedding are listed below for some embodiments of the invention:

Embedding Fluid Selection:
Compatibility of embedding fluid with surface (e.g., matching or comparison of Hildebrand and Hansen solubility parameters, dielectric constant, partition coefficient, pKa, etc.)
Evaporation rate, boiling point, vapor pressure, enthalpy of vaporization of embedding fluid
Diffusion of embedding fluid into surface: thermodynamic and kinetics considerations
Viscosity of embedding fluid
Surface tension of embedding fluid, wicking, and capillary effects
Azeotroping, miscibility, and other interactions with other fluids
Capillary forces
Stability of additives in the fluid compared to stability of the additives in the host material
Application Conditions:
Duration of fluid-surface exposure
Temperature
Humidity
Application method (e.g., spraying, printing, rolling coating, gravure coating, slot-die coating, capillary coating, meniscus coating, cup coating, blade coating, airbrushing, immersion, dip coating, etc.)
Impact/momentum/velocity of additives onto surface (e.g., may influence depth or extent of embedding)
Shear applied to solvent between host material and applicator
Post-processing conditions (e.g., heating, evaporation, fluid removal, air-drying, etc.)
Host Material:
Surface energy
Roughness, porosity, and surface area
Pre-treatments (e.g., ultraviolet ozonation, base etch, cleaning, solvent priming, heating, curing, vacuum, etc.)
Degree of crosslinking, polymerization, and/or gellation
Molecular weight
Crystallinity
Dispersion/suspension of additives in fluid prior to embedding (e.g., additives can remain dispersed in solution through physical agitation, chemical/capping stabilization, steric stabilization, or are inherently solubilized)
Mitigation of undesired effects (e.g., hazing, crazing, blushing, irreversible destruction of host material, uneven wetting, roughness, etc.)

Some, or all, of the aforementioned parameters can be altered or selected to tune a depth or an extent of embedding of additives into a given host material. For example, higher degrees of embedding deep into a surface of a host material can be achieved by increasing a solvency power of an embedding fluid interacting with the host material, matching closely Hansen solubility parameters of the embedding fluid-substrate, prolonging the exposure duration of the embedding fluid in contact with the host material, increasing an amount of the embedding fluid in contact with the host material, elevating a temperature of the system, increasing a momentum of additives impinging onto the host material, increasing a diffusion of either, or both, of the embedding fluid and the additives into the host material, or any combination thereof.

Fluids (e.g., embedding fluids and carrier fluids) can also include salts, surfactants, stabilizers, and other agents useful in conferring a particular set of characteristics on the fluids. Stabilizers can be included based on their ability to at least partially inhibit inter-additive agglomeration. Other stabilizers can be chosen based on their ability to preserve the functionality of additives. Butylated hydroxytoluene (or BHT), for instance, can act as a good stabilizer and as an antioxidant. Other agents can be used to adjust rheological properties, evaporation rate, and other characteristics.

Fluids and additives can be applied so as to be largely stationary relative to a surface of a dry composition. In other embodiments, application is carried out with relative movement, such as by spraying a fluid onto a surface, by conveying a dry composition through a falling curtain of a fluid, or by conveying a dry composition through a pool or bath of a fluid. Application of fluids and additives can be effected by airbrushing, atomizing, nebulizing, spraying, electrostatic spraying, pouring, rolling, curtaining, wiping, spin casting, dripping, dipping, painting, flowing, brushing, immersing, patterning (e.g., stamping, inkjet printing, controlled spraying, controlled ultrasonic spraying, and so forth), flow coating methods (e.g., slot die, capillary coating, meyer rod, blade coating, cup coating, draw down, and the like), printing, gravure printing, lithography, screen printing, flexo printing, offset printing, roll coating, inkjet printing, intaglio printing, or any combination thereof. In some embodiments, additives are propelled, such as by a sprayer, onto a surface, thereby facilitating embedding by impact with the surface. In other embodiments, a gradient is applied to a fluid, additives, or both. Suitable gradients include magnetic and electric fields. The gradient can be used to apply, disperse, or propel the fluid, additives, or both, onto a surface. In some embodiments, the gradient is used to manipulate additives so as to control the extent of embedding. An applied gradient can be constant or variable. Gradients can be applied before a dry composition is softened or swelled, while the dry composition remains softened or swelled, or after the dry composition is softened or swelled. It is contemplated that a dry composition can be heated to achieve softening, and that either, or both, a fluid and additives can be heated to promote embedding. In some embodiments, embedding of additives can be achieved primarily or solely through application of an embedding fluid, without requiring application of gradients or external pressure. In some embodiments, embedding of additives can be achieved through application of pressure (e.g., pressure rollers) in place of, or in conjunction with, an embedding fluid.

Application of fluids and additives and embedding of the additives can be spatially controlled to yield patterns. In some embodiments, spatial control can be achieved with a physical mask, which can be placed between an applicator and a surface to block a segment of applied additives from contacting the surface, resulting in controlled patterning of additive embedding. In other embodiments, spatial control can be achieved with a photomask. A positive or negative photomask can be placed between a light source and a surface, which can correspond to a photoresist. Light transmitted through non-opaque parts of the photomask can selectively affect a solubility of exposed parts of the photoresist, and resulting spatially controlled soluble regions of the photoresist can permit controlled embedding of additives. In other embodiments, spatial control can be achieved through the use of electric gradients, magnetic gradients, electromagnetic fields, thermal gradients, pressure or mechanical gradients, surface energy gradients (e.g., liquid-solid-gas interfaces, adhesion-cohesion forces, and capillary effects), or any combination thereof. Spatial control can also be achieved by printing a material that differs from a host material and in which embedding does not occur (or is otherwise inhibited).

As noted above, additives can be dispersed in an embedding fluid, and applied to a dry composition along with the embedding fluid via one-step embedding. Additives also can be applied to a dry composition separately from an embedding fluid via two-step embedding. In the latter scenario, the additives can be applied in a wet form, such as by dispersing in a carrier fluid or by dispersing in the same embedding fluid or a different embedding fluid. Still in the latter scenario, the additives can be applied in a dry form, such as in the form of aerosolized powder. It is also contemplated that the additives can be applied in a quasi-dry form, such as by dispersing the additives in a carrier fluid that is volatile, such as methanol, another low boiling point alcohol, or another low boiling point organic solvent, which substantially vaporizes prior to impact with a dry composition.

By way of example, one embodiment involves spraying, airbrushing, or otherwise atomizing a solution of nanowires or other additives dispersed in an appropriate carrier fluid onto a dry composition.

As another example, one embodiment involves pre-treating a dry composition by spraying or otherwise contacting an embedding fluid with the dry composition, and then, after the passage of time $t_1$, spraying or airbrushing nanowires or other additives with velocity such that the combination of the temporarily softened dry composition and the velocity of the impinging nanowires allow rapid and durable surface-embedding of the nanowires. $t_1$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in a carrier fluid towards the dry composition. Air-curing or higher temperature annealing optionally can be included.

As another example, one embodiment involves spraying, airbrushing, or otherwise atomizing a solution of nanowires or other additives dispersed in a carrier fluid onto a dry composition. After the passage of time $t_2$, a second spraying, airbrushing, or atomizing operation is used to apply an embedding fluid so as to permit efficient surface-embedding of the nanowires. $t_2$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in the carrier fluid towards the dry composition. Air-curing or higher temperature annealing optionally can be included.

As a further example, one embodiment involves applying nanowires or other additives onto a dry composition composed of sodium silicate or another alkali metal silicate or other solid glass. Either simultaneously or as a separate operation, an embedding fluid composed of heated, basic water is applied in liquid or vapor form to the sodium silicate at either room temperature or elevated temperature, which causes the sodium silicate to at least partially dissolve, thereby permitting entry of the nanowires into the dissolved sodium silicate. The water is evaporated or otherwise removed, causing the sodium silicate to re-solidify with the nanowires embedded within the sodium silicate. Air-curing or higher temperature annealing optionally can be included.

A time period for exposure or otherwise contacting an embedding fluid with a dry composition can be selected, for example, according to a desired extent of embedding, while mitigating against undesired effects such as hazing, crazing, blushing, and so forth. In some embodiments, a exposure time can be, for example, in the range of about 0.1 second to about 24 hours, such as from about 0.5 second to about 12 hours, from about 1 second to about 6 hours, from about 1 second to about 3 hours, from about 1 second to about 2 hours, from about 1 second to about 1 hour, from about 1 minute to about 50 minutes, from about 1 minute to about 40 minutes, from about 1 minute to about 30 minutes, or from about 1 minute to about 20 minutes.

As discussed above, embedding silver nanowires or other types of electrically conductive or semiconducting additives into ceramics can protect the additives from decomposition when exposed to high temperatures. In some embodiments, control over an extent of embedding of the additives is desirable to allow a balance to be attained between "over-embedding" and "under-embedding" the additives.

Figure 3A:
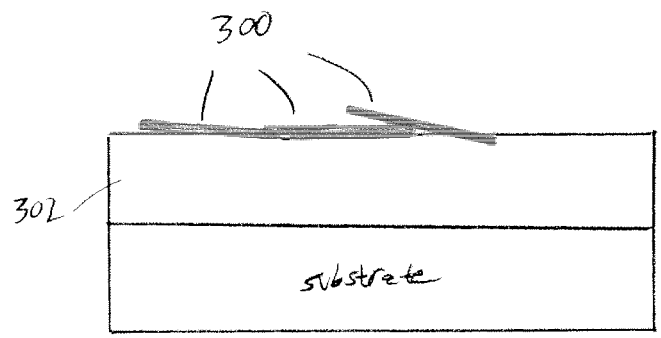
FIG. 3A and FIG. 3B illustrate "under-embedding" and "over-embedding" scenarios, respectively, according to an embodiment of the invention.
Figure 3B:
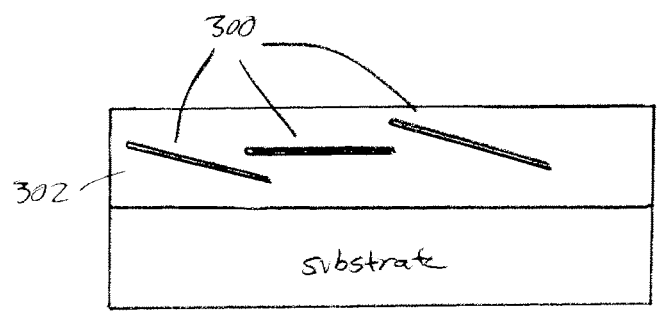

Referring to an "under-embedding" scenario illustrated in FIG. 3A, if nanowires 300 are embedded too shallow into a host material 302, the resulting nanowires 300 are exposed for electrical contact but are susceptible to abrasion, resulting in a nanowire network that is unstable and having non-uniform conductivity. Referring to an "over-embedding" scenario illustrated in FIG. 3B, if the nanowires 300 are embedded deeply into the host material 302, the resulting nanowires 300 are substantially or largely covered by the host material 302. This coverage can protect the nanowires 300 against abrasion or against other types of degradation (e.g., oxidation, sulfidation), but, if the thickness of the coverage of the host material 302 is too thick (and the host material is non-conductive), it can impede electrical contact at a surface of the host material 302. Moreover, this coverage of the nanowires 300 by the host material 302 can result in the host material 302 surrounding each nanowire; this can impede the formation of nanowire-nanowire junctions, and, if the host material 302 thickness around each nanowire is too high, it can, thereby, impede the flow of an electrical current through the nanowires 300.

In terms of attaining a suitable balance between "over-embedding" and "under-embedding" of nanowires or other types of electrically conductive or semiconducting additives, the additives can be partially embedded into a host material to a degree sufficient to resist removal by abrasion while still providing or maintaining a desired level of electrical conductivity in a resulting transparent conductor. Suitable tests and values for abrasion resistance and suitable values for electrical conductivity (in terms of sheet resistance) are set forth above in the overview section for transparent conductors. Also, in some embodiments, a suitable balance can be attained by localization of the additives within a "planar" or "planar-like" embedded region of the host material. In some embodiments, the planar-like embedded region of the host material is entirely underneath the surface of the host material, while, in other embodiments, the planar-like embedded region of the host material is adjacent to the embedding surface, with at least a fraction of the additives exposed at a surface of the host material. For example, an embedded region can have a thickness up to about 10 times (or more) a characteristic dimension of the additives, such as up to about 9 times, up to about 8 times, up to about 7 times, up to about 6 times, up to about 5 times, up to about 4 times, up to about 3 times, or up to about 2 times the characteristic dimension, and down to about 0.05, about 0.1, about 0.2, about 0.3, about 0.4, or about 0.5 times the characteristic dimension. As another example, a thickness of the embedded region can be no greater than about 80% of an overall thickness of the host material, such as no greater than about 50%, no greater than about 40%, no greater than about 30%, no greater than about 20%, no greater than about 10%, or no greater than about 5% of the overall thickness. Additional suitable characteristics of the embedded region are set forth above in the overview section for transparent conductors.

Figure 2C:
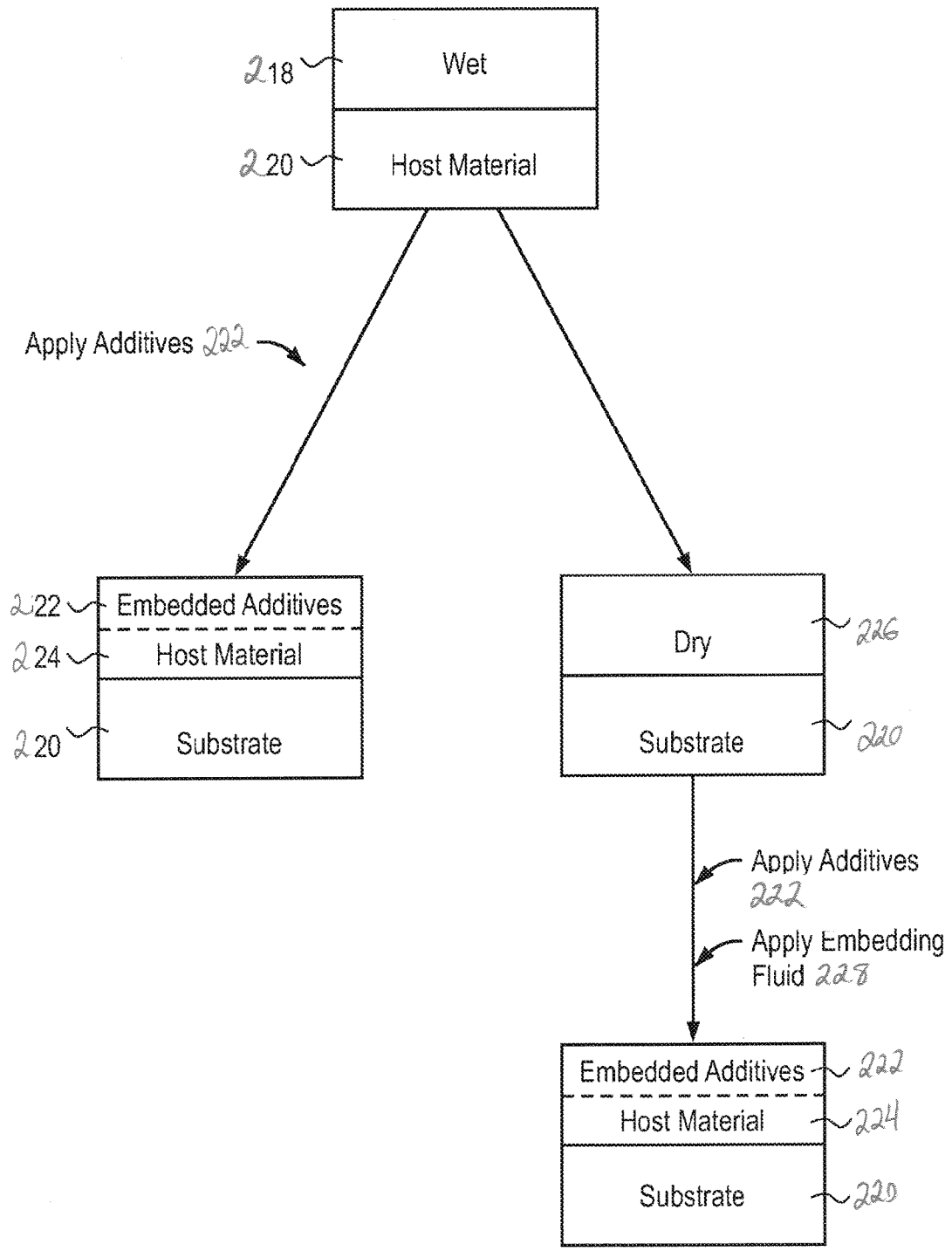

For example, embedding of additives into a dry composition can be carried out by providing a ceramic or a ceramic precursor in the form of a gel or a semisolid that can be swelled by filling pores with an embedding fluid, by elongation of partially uncondensed oligomeric or polymeric chains, by dissolving at least a portion of the ceramic or the ceramic precursor to allow embedding of the additives followed by re-solidification upon fluid removal, or any combination thereof. Additives can be embedded into a surface of a coating while the coating is swelled, dissolved, or wetted. The chemistry of the embedding process can be adjusted, such as by adjusting a degree to which a top portion of the coating is swelled, dissolved, or wetted. Alternatively, or in conjunction, in the case of a silane-based sol-gel precursor, pores within a gel or a semisolid can be at least partially filled with an embedding fluid, or partially uncondensed oligomeric silane chains can be elongated by interaction with the embedding fluid. In such a case, the chemistry can be tuned by adjusting a degree to which the pores are filled with the embedding fluid, or a degree to which silane or other oligomeric or polymeric chains are elongated Attention next turns to FIG. 2C, which illustrates a manufacturing method for surface embedding additives 222 into a wet composition 218, according to an embodiment of the invention. Referring to FIG. 2C, the wet composition 218 is applied to a substrate 220 in the form of a coating that is disposed on top of the substrate 220. The wet composition 218 can correspond to a dissolved form of a host material and, in particular, can include a dissolved form, a colloidal form, a nanoparticle form, a sol-form of any material previously listed as suitable host materials, such as a ceramic, a ceramic precursor, or any combination thereof. It is also contemplated that the wet composition 218 can correspond to a host material precursor, which can be converted into the host material by suitable processing, such as drying, curing, cross-linking, polymerizing, sintering, calcining, or any combination thereof. For example, the wet coating composition 218 can be a coating that is not fully cured or set, a cross-linkable coating that is not fully cross-linked, which can be subsequently cured or cross-linked using suitable polymerization initiators or cross-linking agents, or a coating of monomers, oligomers, or a combination of monomers and oligomers, which can be subsequently polymerized using suitable polymerization initiators or cross-linking agents. The wet composition 218 also can be patterned, for instance, with printing methods like screen, reverse offset gravure, flexo, or ink-jet, printing, or another method. In some embodiments, the wet composition 218 can include a material with a liquid phase as well as a solid phase, or can include a material that is at least partially liquid or has properties resembling those of a liquid, such as a sol, a semisolid, a gel, and the like. The substrate 220 can be transparent or opaque, can be flexible or rigid, and can be composed of, for example, a polymer, an ionomer, EVA, PVB, TPO, TPU, PE, PET, PETG, PMMA, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 220 can serve as a temporary substrate that is subsequently removed during device assembly, or can be retained in a resulting device as a layer or other component of the device.

Next, according to the option on the left-side of FIG. 2C, the additives 222 are applied to the wet composition 218 prior to drying or while it remains in a state that permits embedding of the additives 222 within the wet composition 218. In some embodiments, application of the additives 222 is via a flow coating method (e.g., slot die, capillary coating, meyer rod, cup coating, draw down, and the like). Although not illustrated on the left-side, it is contemplated that an embedding fluid can be simultaneously or separately applied to the wet composition 218 to facilitate the embedding of the additives 222. In some embodiments, embedding of the additives 222 can be achieved through application of pressure (e.g., pressure rollers) in place of, or in conjunction with, an embedding fluid. Subsequently, the resulting host material 224 has at least some of the additives 222 partially or fully embedded into a surface of the host material 224. Suitable processing can be carried out to convert the wet composition 218 into the host material 224. During device assembly, the host material 224 with the embedded additives 222 can be laminated or otherwise connected to adjacent device layers, or can serve as a substrate onto which adjacent device layers are formed, laminated, or otherwise applied.

Certain aspects regarding the application of the additives 222 and the embedding of the additives 222 in FIG. 2C can be carried out using similar processing conditions and materials as described above for FIG. 2A and FIG. 2B, and those aspects need not be repeated below. The following provides additional details on embodiments related to ceramics and ceramic precursors.

In some embodiments, additives are embedded into a wet composition in the form of a coating of a liquid ceramic precursor, which may include a solvent and a set of reactive species. The embedding is carried out before the solvent has fully dried and/or after drying but before curing, followed by the option of curing or otherwise converting the ceramic precursor to a fully condensed or restructured glass. Examples of ceramic precursor reactive species include spin-on glasses, silanes (e.g., Si(OR)(OR')(OR")(R'''), Si(OR)(OR')(R")(R'''), and Si(OR)(R')(R")(R'''), where R, R', R", and R''' are independently selected from hydrogen atoms, alkyl groups, alkenyl groups, alkynyl groups, and aryl groups), titanium analogues of silanes, cerium analogues of silanes, magnesium analogues of silanes, germanium analogues of silanes, indium analogues of silanes, tin analogues of silanes, zinc analogues of silanes, aluminium analogues of silanes, any mixed metal analogues of silanes, siloxanes (e.g., Si(OR)(OR')(OR")(OR'''), where R, R', R", and R''' are independently selected from hydrogen atoms, alkyl groups, alkenyl groups, alkynyl groups, and aryl groups), titanium analogues of siloxanes, cerium analogues of siloxanes, magnesium analogues of siloxanes, germanium analogues of siloxanes, indium analogues of siloxanes, tin analogues of siloxanes, zinc analogues of siloxanes, aluminium analogues of siloxanes, any mixed metal analogues of siloxanes, alkali metal silicates (e.g., sodium silicate and potassium silicate), or any combination thereof. As more specific examples, a ceramic precursor reactive species can be a siloxane such as tetramethoxysilane (or TMOS), tetraethoxysilane (or TEOS), tetra(isopropoxy)silane, titanium analogues thereof, cerium analogues thereof, magnesium analogues thereof, germanium analogues thereof, indium analogues thereof, tin analogues thereof, zinc analogues thereof, aluminium analogues thereof, any mixed metal analogues thereof, or any combination thereof.

In some embodiments, reactive species are at least partially reacted, prior to embedding of additives. Reaction can be carried out by, for example, hydrolysis in the presence of an acid and a catalyst and followed by condensation, thereby yielding oligomeric or polymeric chains. For example, silanes and siloxanes can undergo partial condensation to yield oligomeric or polymeric chains with Si—O—Si linkages, and at least some side groups corresponding to (OR) or (R).

In some embodiments, a liquid ceramic precursor includes at least two different types of reactive species. The different types of species can react with each other, as exemplified by two or more of TEOS, TMOS, and tetra(isopropoxy)silane, and can be suitably selected in order to control evaporation rate and pre-cured film morphology. Reactive species with larger side groups, such as isopropoxy in the case of tetra(isopropoxy)silane versus methoxy in the case of TMOS, can yield larger pore sizes when converted into a gel, which larger pore sizes can facilitate swelling in the presence of an embedding fluid. Also, upon hydrolysis, larger side groups can be converted into corresponding alcohols with lower volatility, such as isopropyl alcohol in the case of tetra(isopropoxy)silane versus methanol in the case of TMOS, which can slow the rate of drying. In other embodiments, the different types of species are not likely to react, such as sodium silicate and tetra(isopropoxy)silane. This can afford facile curing properties of a bulk of a matrix formed by drying the silicate, while retaining some amount of delayed condensation to allow embedding of additives.

In some embodiments, reactive species, either prior to reaction or subsequent to reaction, can include some amount of Si—C or Si—C—Si linkages, which can impart toughness, porosity, or other desirable characteristics, such as to allow trapping of a solvent to slow the rate of drying or to promote swelling in the presence of an embedding fluid.

In some embodiments, reactive species, either prior to reaction or subsequent to reaction, can include Si—OR groups, where R is a long chain side group with low volatility to slow the rate of drying of a coating of a liquid ceramic precursor. In other embodiments, reactive species can include Si—R' groups, where R' is a long chain side group with low volatility to slow the rate of drying of a coating of a liquid ceramic precursor. Either, or both, of R and R' also can have characteristics to interact and retain a solvent, thereby slowing the drying process. For example, R and R' can have polarity, non-polarity, aliphatic characteristics, or other characteristics that match those of the solvent.

In some embodiments, a solvent included in a liquid ceramic precursor can include water, an alcohol, dimethylformamide, dimethyl sulfoxide, another polar solvent, another non-polar solvent, any other suitable fluid listed above, or any combination thereof. For example, the solvent can be non-polar, and water can be used heterogeneously during hydrolysis, with complete condensation occurring after drying a coating of the ceramic precursor. As another example, a combination of solvents can be selected, such that a major component has high volatility in order to carry, wet, or level reactive species, whereas a minor component has low volatility to delay drying of the coating. It is also contemplated that the reactive species can form a relatively small fraction of a total coating volume to slow drying.

In some embodiments, a liquid ceramic precursor can be applied to a substrate using a wide variety of coating methods, such as a roll-to-roll process, roll coating, gravure coating, slot dye coating, knife coating, spray coating, and spin coating. For example, the liquid ceramic precursor can be applied by spin coating, and additives can be deposited upon the start of spin coating or after the start of spin coating, but before the resulting coating has dried on a spinner.

In some embodiments, additives can be dispersed in a carrier fluid, and then applied in a wet form to a liquid ceramic precursor. The carrier fluid can include the same solvent (or another solvent having similar characteristics) as a low volatility component of the liquid ceramic precursor in order to reduce or avoid adverse interaction upon impact. It is also contemplated that the carrier fluid can be volatile (e.g., methanol or another low boiling alcohol), which substantially evaporates (or at least partially evaporates) prior to impact. Another example of a suitable carrier fluid is water.

In some embodiments, curing can be carried out after embedding such that a liquid ceramic precursor is converted into a glass. For example, curing can involve heating to a temperature in the range of about 400° C. to about 500° C. in nitrogen (optionally containing water vapor (possibly saturated)), heating up to a temperature sufficient to remove residual solvent (e.g., from about 100° C. to about 150° C.), or heating to a temperature in the range of about 800° C. to about 900° C. to form a fully condensed glass. Curing can be omitted, such as in the case of sodium silicate (or another alkali silicate) that can dry under ambient conditions into a robust "clear coat." In some embodiments, curing can also serve as a sintering/annealing operation for embedded nanowires or other additives, for instance, heating up to a temperature for a low-temperature sintering/fusing of nanowire junctions (e.g., from about 100° C. to about 250° C.). In some embodiments, pre-curing can be carried out before embedding in order to stabilize a coating to withstand shear or fluid forces, but still be in a state to allow embedding of additives.

Turning back to FIG. 2C and referring to the option on the right-side, the wet composition 218 can be initially converted into a dry composition 226 by suitable processing, such as by at least partially drying, curing, cross-linking, polymerization, or any combination thereof. Next, the additives 222 and an embedding fluid 228 can be applied to the dry composition 226. The additives 222 can be in solution or otherwise dispersed in the embedding fluid 228, and can be simultaneously applied to the dry composition 226 via one-step embedding. Alternatively, the additives 222 can be separately applied to the dry composition 226 before, during, or after the embedding fluid 228 treats the dry composition 226. As noted above, the separate application of the additives 222 can be referred as two-step embedding. Subsequently, the resulting host material 224 has at least some of the additives 222 partially or fully embedded into the surface of the host material 224. Optionally, suitable processing can be carried out to convert the dry composition 226 into the host material 224, such as by additional drying, curing, cross-linking, polymerization, or any combination thereof. Any, or all, of the manufacturing stages illustrated in FIG. 2C can be carried out in the presence of a vapor environment of a suitable fluid (e.g., an embedding fluid or other suitable fluid) to facilitate the embedding of the additives 222, to slow drying of the wet composition 218, or both.

Certain aspects regarding the application of the additives 222 and the embedding fluid 228 and the embedding of the additives 222 in FIG. 2C can be carried out using similar processing conditions and materials as described above for FIG. 2A and FIG. 2B, and those aspects need not be repeated below. In particular, and in at least certain aspects, the processing conditions for embedding the additives 222 into the dry composition 226 of FIG. 2C can be viewed as largely parallel to those used when embedding the additives 212 into the dry composition 208 of FIG. 2B. The following provides further details on embodiments related to ceramics and ceramic precursors.

In some embodiments, additives are embedded into a dry composition in the form of a coating of an uncured (or not fully cured) ceramic precursor, which has been initially dried but is later swelled by an embedding fluid. This is followed by drying of the embedding fluid, contracting a coating matrix around the additives. In some instances, the embedding fluid can include the same solvent (or another solvent having similar characteristics) as that of the ceramic precursor prior to drying, in which case the processing conditions can be viewed as largely parallel to those used when embedding additives into a wet composition. Embedding of additives is followed by the option of curing or otherwise converting the ceramic precursor to a fully condensed or restructured glass.

In some embodiments, reactive species are selected to be initially oligomeric or polymeric (e.g., as opposed to monomers like TEOS or TMOS) prior to hydrolysis and condensation. Such oligomeric or polymeric form of the reactive species can promote swelling in the presence of an embedding fluid. Examples include reactive species available under the designations of Methyl 51, Ethyl 50, Ethyl 40, and the like. In other embodiments, oligomeric or polymeric reactive species can be formed by reacting monomeric reactive species, such as via hydrolysis and condensation, to reach a desired molecular weight. The oligomeric or polymeric reactive species can be combined with monomeric reactive species, with the different species being miscible, partially miscible, or largely immiscible. Such oligomeric or polymeric reactive species also can be used according to the left-side option of FIG. 2C, namely by including such oligomeric or polymeric reactive species in a coating of a liquid ceramic precursor and embedding additives into the coating prior to drying, optionally in the presence of an embedding fluid.

In some embodiments, reactive species can include monomers with up to two reactive sites, such as silicones, silsesquioxanes, and the like. Upon reaction, such reactive species can form polymer chains with a controllable amount of cross-linking, thereby promoting swelling in the presence of an embedding fluid and facilitating embedding of additives. For example, the reactive species can include $Si(OR)_2R'_2$, such as $Si(OCH_2CH_3)_2(CH_3)_2$, which typically does not crosslink below about 400° C., can swell with an embedding fluid due to its polymeric nature, and can be subsequently cross-linked into a glass by heating to above 400° C. Such polymeric reactive species also can be used according to the left-side option of FIG. 2C, namely by including such polymeric reactive species in a coating of a liquid ceramic precursor and embedding additives into the coating prior to drying, optionally in the presence of an embedding fluid.

According to some embodiments, additives can be partially embedded in a ceramic or a ceramic precursor, and then covered with a relatively thin over-coating to protect the nanowires against abrasion while still affording surface conductivity via tunneling or breakage of the over-coating or conductivity of the over-coating. Because of the abrasion resistance afforded by the over-coating, control over an extent of embedding can be relaxed, such as by permitting under-embedding of the additives and enlarging a process window. In another implementation, a transparent conductor also includes an over-coating adjacent to the surface opposite the embedding surface, which can serve to act as a buffer layer.

Figure 4A:
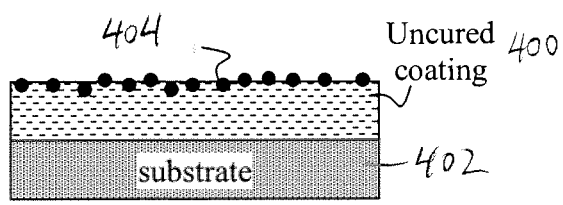
FIG. 4 through FIG. 8 illustrate manufacturing methods to form transparent conductors, according to embodiments of the invention.
Figure 4B:
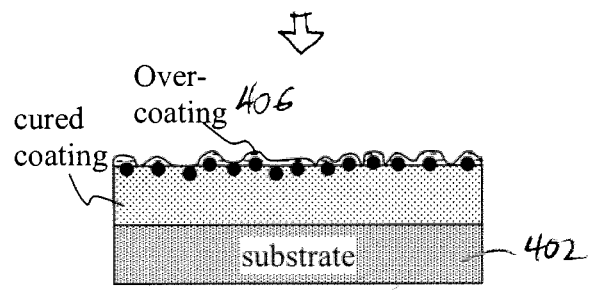
Figure 4C:
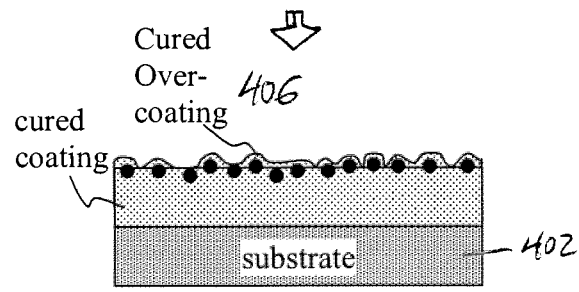

A manufacturing method incorporating an over-coating operation is illustrated in FIG. 4A through FIG. 4C. A coating 400 of a ceramic precursor is formed on a substrate 402, and additives 404 are applied on and partially embedded into the coating 400, as illustrated in FIG. 4A. The substrate 402 can be composed of, for example, a polymer, an ionomer, EVA, PVB, TPO, TPU, PE, PET, PETG, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 402 can serve as a temporary substrate that is subsequently removed during device assembly, or can be retained in a resulting device as a layer or other component of the device. The ceramic precursor can be, for example, a sol-gel precursor of a silicon dioxide glass or other ceramic, such as a solution of TEOS in ethanol, methanol, 2-propanol, n-propanol, 2-methyl-2-propanol, 1-butanol, trifluoroethanol, hexafluoropropanol, water, or any combination thereof. Furthermore, the solvent can be pH-adjusted using HCl, $HNO_3$, NaOH, $NH_4OH$, or other acids and bases. Non-alcohols also are suitable for embedding additives, although alcohols can be desirable to stabilize silver nanowires in some embodiments. The ceramic precursor can be applied to the substrate 402 by, for example, blade coating or another suitable application method, and heated slightly to drive off excess liquid. The remaining ceramic precursor can be referred as "A-staged" or in the "A-stage," and can be partially or fully cured.

Next, the additives 404 are covered with an over-coating 406, as illustrated in FIG. 4B. The over-coating 406 can be composed of the same type of ceramic precursor as the coating 400, or can be composed of a ceramic precursor that differs in some fashion. The over-coating 406 can be applied or formed over the additives 404 by, for example, blade coating, spraying, or another suitable application method, and then cured or otherwise processed, as illustrated in FIG. 4C. It is noted that the over-coating 406 alternatively can be applied by lamination or deposition techniques, such as physical vapor deposition (e.g., sputtering, electron beam physical vapor deposition, evaporative deposition, and pulsed laser deposition), chemical vapor deposition, and atomic layer deposition. Curing of the over-coating 406 can be carried out by heating at a suitable temperature or within a suitable temperature range. By way of example, heating from about 40° C. to about 200° C. is one type of curing where pores can be substantially irreversibly shrunken, or where molecular chains can be substantially fully condensed. As another example, curing can be accomplished by heating at a temperature ranging from about 200° C. to about 500° C. so that a resulting ceramic structure is rendered more rigid and ordered. Another curing method can be carried out in the presence of HCl vapor (or another acidic vapor) at room temperature or at an elevated temperature. A further curing method can be carried out in the presence of ammonia vapor (or another basic vapor). Curing of the coating 400 also can occur in conjunction with curing of the over-coating 406. In some embodiments, the over-coating 406 can be conformal to the surface (as visually depicted in FIG. 4B and FIG. 4C), or the over-coating 406 can be non-conformal, thereby acting as a planarization layer, which can reduce the roughness of the coating 400 and additive 404 composite.

Although a specific embodiment incorporating an over-coating operation is illustrated in FIG. 4A through FIG. 4C, other embodiments are contemplated. For example, an over-coating operation also can be incorporated in the manufacturing methods illustrated in FIG. 2A through FIG. 2C. As another example, an over-coating can be composed of an electrically conductive material, a semiconducting material, or both. Examples of electrically conductive and semiconducting materials include those listed as suitable additives herein. The use of electrically conductive and semiconducting materials can bridge additive-additive gaps, thereby providing a desired level of electrical conductivity even in the presence of such gaps. Additive-additive gaps, when the materials are non-conducting, can increase junction resistance or make junctions non-existent, whereas, when the materials are conducting or semiconducting, the materials can lower or minimize junction resistance and improve junction formation. Application of an electrically conductive or semiconducting over-coating can be carried out in a variety of ways. For example, in the case of ITO or another conductive oxide or chalcogenide, an over-coating can be physical vapor deposited (e.g., sputtered) onto a composition with surface-exposed, surface-embedded additives. Conductive oxides and chalcogenides also can be applied by liquid or solution deposition, as further explained in the following sections. In the case of an electrically conductive polymer, a carbon-based coating, a composite material coating (e.g., a silver ink or paste), and other types of coatings, an electrically conductive material can be applied by coating, spraying, flow coating, and so forth.

In some implementations, the over-coating 406 can be patterned, such as an aperiodic (or non-periodic, random) pattern or a periodic pattern, such as a grid pattern, a diamond pattern, a square pattern, a rectangular pattern, a triangular pattern, another polygonal pattern, a wavy pattern, an angular pattern, an interconnect pattern, or any combination thereof. In some implementations, these types of patterned over-coatings can be used for applications including solar photovoltaics, wherein the over-coatings can be likened to the busbars and fingers used to collect current.

To allow electrical conductivity via tunneling, a thickness of the over-coating 406 can be up to about 200 nm, such as up to about 150 nm, up to about 100 nm, up to about 90 nm, up to about 80 nm, up to about 70 nm, up to about 60 nm, up to about 50 nm, up to about 40 nm, up to about 30 nm, or up to about 20 nm, and down to about 5 nm, down to about 2 nm, or down to about 1 nm. In some implementations, the over-coating 406 can be thicker, such as up to about 100 µm, up to about 10 µm, or up to about 1 µm, depending on an electrical conductivity of the over-coating material and whether electrical or surface conductivity is desirable or undesirable. In the case of an over-coating composed of a dielectric ceramic or another material, a dielectric constant of the over-coating at room temperature can be in the range of about 1.5 to about 30, such as from about 2 to about 25, from about 2 to about 20, from about 3 to about 20, from about 4 to about 20, from about 5 to about 20, or from about 10 to about 20.

Incorporation of Additives into Transparent Conductive Matrices

Certain embodiments of transparent conductors include additives that are incorporated into host materials that are themselves electrically conductive or semiconducting. In some embodiments, a host material serves as a transparent conductive matrix, with incorporation of electrically conductive or semiconducting additives imparting improved characteristics (e.g., electrical conductivity) as a result of the inter-action between the transparent conductive matrix and the additives. Some embodiments of transparent conductors include conductive oxides or chalcogenides that incorporate additives, such as microwires, nanowires, nanotubes, or both.

Transparent conductors are typically formed through the use of a dry process to deposit a film of a conductive oxide, such as through the use of specialized physical vapor deposition (e.g., sputtering) or specialized chemical vapor deposition techniques. The resulting film can exhibit good transparency and good electrical conductivity. However, drawbacks to such techniques include high cost, high process complexity, intensive energy requirements, high capital expenditures for equipment, and poor productivity.

A film of a conductive oxide also can be formed through the use of a wet chemical process, such as through coating, printing, or depositing the film as a liquid, a solution, or a dispersion. The formulation and liquid deposition of a conductive oxide can involve applying a sol-gel precursor of the conductive oxide or a dispersion of nanostructures of the conductive oxide, followed by suitable treatment to cure, coalesce, or sinter the conductive oxide into a solid film. A conductive oxide film formed from a sol-gel precursor can exhibit a higher smoothness at a surface, whereas a film formed from a dispersion of nanostructures can exhibit somewhat higher surface roughness. Also, the former type of film can be somewhat thinner than the latter type of film, while yielding similar sheet resistance and transmittance. The ability to liquid deposit conductive oxide films would allow rapid, direct, lower cost, and lower complexity application onto various substrates, including flexible substrates. Being able to print or roll-to-roll process conductive oxide films would present a lower cost alternative to vacuum-based techniques, such as physical vapor deposition. In addition, a liquid-deposited conductive oxide film can have different film thickness uniformity, hardness, friction, wear resistance, or adhesion compared to physical vapor deposited films.

A current drawback of liquid-deposited conductive oxide films is that, to date, such conductive oxide films can have a higher sheet resistance by about 2 to 3 orders of magnitude compared to conductive oxide films formed by a dry process. For example, sheet resistances of such liquid-deposited conductive oxide films can be in the range of about 2-10 k$\Omega$/sq, which can be too high to meet specifications of transparent conductive electrodes for display, solar, and other applications. ITO nanoparticles, for example, can have an individual resistivity of about $2 \times 10^{-4}$ Ωcm, but films formed from such nanoparticles can have a resistivity of about $10^{-2}$ Ωcm, indicating that much of the additional resistance derives from grain boundaries and interfacial electron scattering as a result of the grain boundaries.

Certain embodiments of transparent conductors leverage the benefits of liquid-deposited conductive oxide films, while addressing their drawback of lower electrical conductivity through the incorporation of nanowires or other electrically conductive or semiconducting additives. The use of a conductive oxide as a host material allows additive-additive gaps to be bridged by the conductive oxide, thereby providing a desired level of electrical conductivity even in the presence of such gaps and even with a density of the additives being below an electrical percolation threshold in the absence of the conductive oxide. In other words, additive-additive conductivity can be preserved as a current passes through the conductive oxide between additives that are not in direct contact with one another. In the case of films formed from fused (e.g., fully or partially fused or sintered) nanostructures of a conductive oxide, incorporating additives into these films aids in bridging junctions, boosting conductivity, and maintaining desired levels of transparency. Moreover, the conductive oxide can provide surface conductivity, even after embedding additives deeper into the conductive oxide, or even with the additives distributed within the conductive oxide through bulk incorporation. As a result, control over an extent of embedding or a spatial distribution of additives can be relaxed, such as by permitting over-embedding or bulk incorporation of the additives and enlarging a process window. Advantageously, characteristics of the conductive oxide need not be relied as a primary or sole driver for electrical conductivity of a resulting transparent conductor. Instead, the conductive oxide can be used to provide electrical connections between adjacent additives, thereby forming a network of additives (with gaps bridged by the conductive oxide) to provide levels of electrical conductivity at least comparable, if not superior, to conductive oxide films formed by a dry process. Although certain aspects of the foregoing discussion refer to conductive oxides, it should be understood that these aspects are similarly applicable to conductive chalcogenides, as well as other electrically conductive or semiconducting materials that can be used as a transparent conductive matrix.

Suitable transparent conductive oxides and chalcogenides include metal oxides and metal chalcogenides that are doped or undoped. Transparent conductive oxides and chalcogenides can be crystalline, polycrystalline, or amorphous. Examples include ITO (or tin-doped indium oxide, e.g., $In_2O_3$:Sn), fluorine-doped tin oxide (e.g., $SnO_2$:F or FTO), antimony-doped tin oxide (e.g., $SnO_2$:Sb), aluminum-doped zinc oxide (e.g., ZnO:Al or AZO), gallium-doped zinc oxide (e.g., ZnO:Ga), boron-doped zinc oxide (e.g., ZnO:B), indium-doped zinc oxide (e.g., ZnO:In), cadmium oxide (doped or undoped), cadmium sulfide (doped or undoped), zinc sulfide (doped or undoped), zinc-doped aluminum oxide, and cadmium tin oxides (doped or undoped, e.g., $Cd_2SnO_4$). A cadmium-tin system (e.g., Cd—Sn alloy), lanthanum-doped strontium titanate, and yttrium-doped strontium titanate also can be used as a transparent conductive matrix. Additional examples of suitable materials include metal salts, metal oxides, metal chalcogenides, and other metal-containing compositions of In, Sn, Cd, Zn, Ga, Ti, Ag, Sb, Mg, Cu, Ni, Al, Fe, Co, Sc, Sr, La, Se, W, or any combination thereof.

Figure 5:
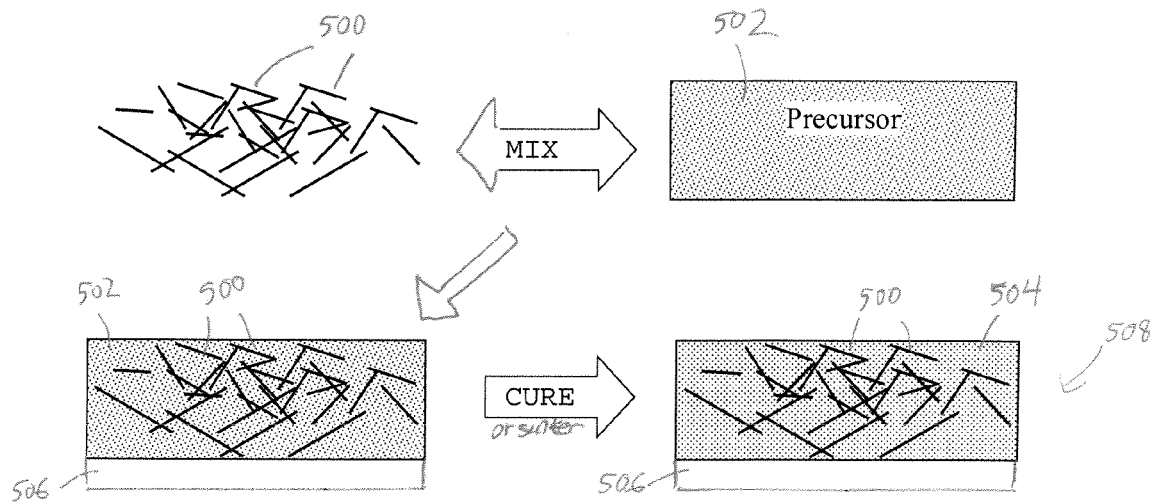

A manufacturing method for bulk incorporation of additives into a transparent conductive matrix 504 is illustrated in FIG. 5. Referring to the upper portion of FIG. 5, nanowires 500 (e.g., silver nanowires) are mixed with a precursor 502 of the transparent conductive matrix 504. Other types of electrically conductive or semiconducting additives can be used in place of, or in conjunction with, the nanowires 500.

The precursor 502 can include, for example, a sol-gel precursor. A sol-gel process typically refers to a wet chemical process for material fabrication, such as a film, a sheet, or a layer of a metal oxide. In some embodiments, the process starts from a chemical solution (or sol) that acts as a precursor for a network (or gel) of discrete particles or polymers. The precursor can undergo various forms of hydrolysis and poly-condensation reactions. In some embodiments, the sol gradually evolves towards the formation of a gel-like diphasic system including both a liquid phase and a solid phase whose morphologies can range from discrete particles to polymer networks.

A sol-gel precursor can include one or more element sources (e.g., metal sources), a solvent, and optionally a catalyst. Examples of element sources for ITO include indium (III) chloride, indium (III) acetylacetonate, indium (III) acetate, indium (III) nitrate, indium (III) alkoxides (e.g., alkyl esters of indium (III) hydroxide analogs to TEOS and TMOS), tin (IV) chloride, tin acetate, tin isopropoxide, and tin alkoxides (e.g., alkyl esters of tin hydroxide analogs to TEOS and TMOS). Examples of element sources for aluminum-doped zinc oxide include aluminum nitrate, aluminum chloride, and zinc acetate. Example solvents include 2-methoxyethanol, ethanol, methanol, 2-propanol, terpineol, other alcohols, acetyl acetone, ethylene glycol, and glycerol. Examples of catalysts include hydrochloric acid, water, and ammonia. By way of example, a sol-gel precursor can be a precursor of zinc oxide (doped or undoped), ITO, an oxide of aluminum and zinc, fluorine-doped tin oxide, doped cadmium oxide, or another doped or undoped metal oxide or chalcogenide. By way of example, for zinc-doped aluminum oxide, the precursor can include a 0.1 M ethanol solution of zinc acetate plus aluminum nitrate in which a molar ratio of Zn/(Zn+Al)=0.01. By way of example for ITO, the precursor can include a 0.1 M ethanol solution of indium isopropoxide plus tin acetate in which a molar ratio of Sn/(Sn+In)=0.10. More generally, a molar ratio of a doping element relative to a combined amount of the doping element and a main element is in the range of about 0.01 to about 0.3, such as from about 0.02 to about 0.25, from about 0.02 to about 0.2, or from about 0.05 to about 0.15.

Additional examples of element sources for a particular metal M include $M_xCl_y$, $M_x(NO_3)_y$, $M_x(acac)_y$, $M_x(acetate)_y$, and $M_x(OR)$, where "acac" refers to acetylacetonate, and "R" refers to hydrogen or an alkyl group. By way of example, M can be In, Sn, Al, or any other metal to create a desired transparent conductive matrix. Sol-gel precursors for metal oxides and chalcogenides are typically less reactive than the corresponding silicon-based chemistry, so curing at somewhat higher temperatures or the inclusion of faster leaving groups (e.g., groups other than —OR groups, or such groups with less bulky R) can be desirable.

Mixing the nanowires 500 with the precursor 502 can be carried out in a number of ways. For example, the nanowires 500 can be mixed with a solvent, such as ethanol, and the nanowire/solvent mixture can be mixed with the precursor 502, which can be pre-mixed with ethanol or a different solvent. Other examples of suitable solvents include 2-propanol, ethylene glycol, methanol, toluene, methyl ethyl ketone, trifluoroethanol, tetrafluoropropanol, cyclohexanone, and the like.

Another option for mixing the nanowires 500 with the precursor 502 is to synthesize the nanowires 500 in the presence of the precursor 502 either in addition to or instead of a conventional templating reagent, such as polyvinylpyrrolidone (or PVP). Sol-gel precursors can be selected to have similar coordination properties of a templating agent or to have a suitable functional group attached, such as a pyrrolidone group in the case of a PVP templating reagent. The nanowires 500 can be synthesized from nanoparticles through heating in the presence of a material that preferentially binds to a specific crystal face, thereby yielding preferential growth along a specific direction.

Another option for mixing the nanowires 500 with the precursor 502 is for the nanowires 500 to be removed from a native solvent, and reconstituted or redispersed with a sol-gel solvent of the precursor 502, a binder, or both. Another option for mixing the nanowires 500 with the precursor 502 is to synthesize the nanowires 500 in-situ or just prior to mixing, for instance, via electrospinning, a liquid process, the polyol process, or another process.

In place of, or in addition to, a sol-gel precursor, the precursor 502 can include nanostructures composed of a material of the transparent conductive matrix 504, such as nanoparticles of a conductive oxide, nanoparticles of a conductive chalcogenide, or both. Nanostructures of a conductive oxide or chalcogenide can be provided in the form of a dispersion in a suitable liquid, and can be applied by a wet chemical process similar to a sol-gel precursor. Nanostructures can be synthesized by liquid phase co-precipitation of metal sources, such as metal salts and other metal sources similar to those listed for sol-gel precursors. Other methods of synthesizing conductive oxide or chalcogenide nanostructures include emulsion techniques, microwave-assisted synthesis, solvothermal synthesis, laser-induced fragmentation, and so forth. Conductive oxide or chalcogenide nanostructures can be synthesized or dispersed with polymer ligands, which can retain the nanostructures together or in close proximity with some degree of organic cross-linking. The ligands or other stabilization agents also can be used to impede the formation of larger agglomerates in a deposited film, thereby leading to enhanced electrical and optical properties of the film. Once synthesized, nanostructures of a conductive oxide or chalcogenide can be removed from a native solvent by precipitation and purification, and optionally reconstituted or redispersed with a solvent, a binder, or both.

Once the nanowires 500 are mixed with the precursor 502, the resulting mixture or dispersion is applied over a substrate 506 as a coating by spraying, printing, rolling, gravure coating, slot-die coating, cup coating, blade coating, capillary coating, immersion, dip coating, or another suitable wet chemical process, as illustrated in the lower portion of FIG. 5. The substrate 506 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 506 can serve as a temporary substrate that is subsequently removed during device assembly, or can be retained in a resulting device as a layer or other component of the device. Next, the mixture applied over the substrate 506 is cured, which can include a variety of thermal, chemical, or physical treatment to form the transparent conductive matrix 504 as a solid film, sheet, or layer with the nanowires 500 incorporated therein. Curing can include, for example, calcining, sintering, annealing, forming gas exposure, precursor gas exposure, ultraviolet exposure, infrared exposure, or any combination thereof. For example, curing can be carried out by heating to about 500° C. to about 600° C., or by heating to about 50° C. in a dilute HCl environment. In the case of a dispersion of nanostructures of a conductive oxide or chalcogenide, curing can be carried out to at least partially coalesce, fuse, or merge the nanostructures, such as through annealing or sintering.

Referring to the lower portion of FIG. 5, a resulting transparent conductor 508 includes the nanowires 500 spatially arranged randomly throughout a substantial portion of, or substantially the entire, volume or thickness of the transparent conductive matrix 504. Unlike localization to a "planar" or "planar-like" embedded region, the nanowires 500 are arranged in a manner more closely conforming to a three-dimensional network than a two-dimensional network. Because the transparent conductive matrix 504 can provide electrical connections between adjacent nanowires 500, physical contact between adjacent nanowires 500 is not required. For example, the transparent conductor 508 can have desirable levels of electrical conductivity if the nanowires 500 are sufficiently closely spaced from one another, such as where a density of the nanowires 500 is such that the nanowires 500, on average, are no greater than about 500 nm apart, no greater than about 400 nm apart, no greater than about 300 nm apart, no greater than about 200 nm apart, no greater than about 100 nm apart, no greater than about 50 nm apart, or no greater than about 10 nm apart. Through bulk incorporation within the transparent conductive matrix 504, the nanowires 500 are protected from decomposition when exposed to high temperatures, thereby maintaining desired levels of electrical conductivity. Other spatial arrangements of the nanowires 500 are contemplated. For example, the nanowires 500 can self-orient within the precursor 502 with some degree of order prior to curing, or the nanowires 500 can bloom or migrate towards a surface of the precursor 502, resulting in exposure of at least a fraction of the nanowires 500 at a surface of the transparent conductive matrix 504.

Figure 6:
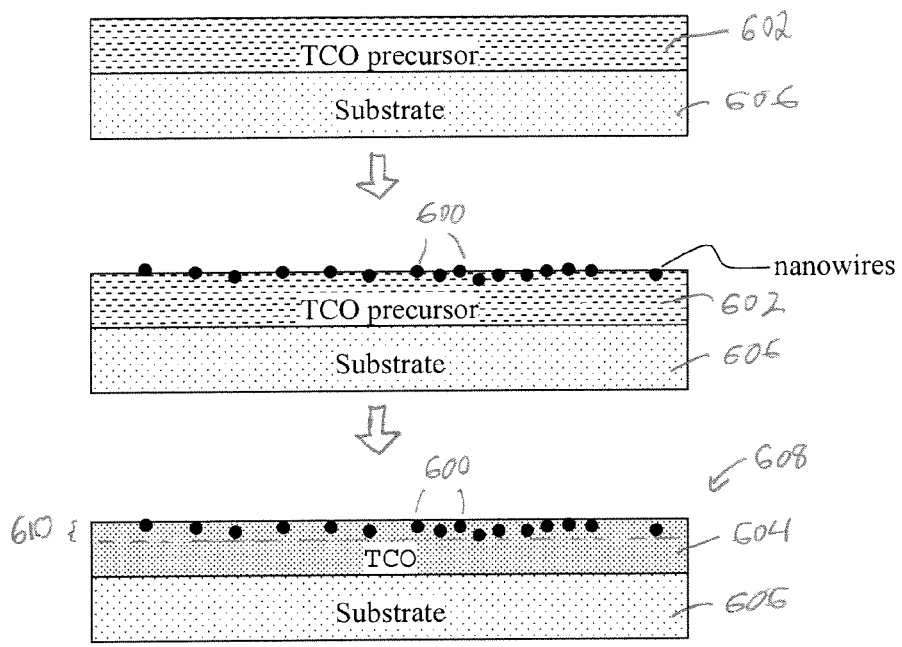

A manufacturing method for surface embedding of additives into a transparent conductive matrix 604 is illustrated in FIG. 6. Referring to the upper portion of FIG. 6, a precursor 602 of the transparent conductive matrix 604 is applied over a substrate 606 as a coating by spraying, printing, rolling, gravure coating, slot-die coating, cup coating, blade coating, capillary coating, meniscus coating, immersion, dip coating, or another suitable wet chemical process. The precursor 602 can include, for example, a sol-gel precursor of a metal oxide or chalcogenide, a dispersion of nanostructures of a metal oxide or chalcogenide, or a combination thereof. Examples of suitable materials for the precursor 602 are set forth above in connection with FIG. 5. The substrate 606 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 606 can serve as a temporary substrate that is subsequently removed during device assembly, or can be retained in a resulting device as a layer or other component of the device.

Next, nanowires 600 (e.g., silver nanowires) are applied to the precursor 602, as illustrated in the middle portion of FIG. 6. For example, the nanowires 600 can be mixed with a solvent, such as ethanol, 2-propanol, ethylene glycol, methanol, toluene, methyl ethyl ketone, trifluoroethanol, tetrafluoropropanol, cyclohexanone, and the like, and the nanowire/solvent mixture can be applied to the precursor 602, which can include the same or a different solvent. Other types of electrically conductive or semiconducting additives can be used in place of, or in conjunction with, the nanowires 600. The nanowires 600 are applied to the precursor 602 prior to drying or curing (e.g., fully drying or fully curing) or while it remains in a state that permits embedding of the nanowires 600 within the precursor 602. Optionally, the precursor 602 can be at least partially dried or cured prior to application of the nanowires 600. It is contemplated that an embedding fluid can be simultaneously or separately applied to the precursor 602 to facilitate the embedding of the nanowires 600. Subsequently, the precursor 602 has at least some of the nanowires 600 partially or fully embedded into a surface of the precursor 602. Certain aspects regarding the application and the embedding of the nanowires 600 in FIG. 6 can be carried out using similar processing conditions and materials as described above for FIG. 2C. In particular, and in at least certain aspects, the processing conditions for embedding the nanowires 600 into the precursor 602 of FIG. 6 can be viewed as largely parallel to those used when embedding the additives 222 into the wet composition 218 of FIG. 2C.

Another option for embedding the nanowires 600 is to synthesize the nanowires 600 over the precursor 602. The nanowires 600 can be partially or fully embedded into a surface of the precursor 602 during or subsequent to their synthesis.

Next, as illustrated in the lower portion of FIG. 6, the precursor 602 (with the embedded nanowires 600) is cured, which can include a variety of thermal, chemical, or physical treatment to form the transparent conductive matrix 604 as a solid film, sheet, or layer with the nanowires 600 incorporated therein. Curing can include, for example, calcining, sintering, annealing, forming gas exposure, precursor gas exposure, ultraviolet exposure, infrared exposure, or any combination thereof. In the case of a dispersion of nanostructures of a conductive oxide or chalcogenide, curing can be carried out to at least partially coalesce, fuse, or merge the nanostructures, such as through annealing or sintering.

One or more additional layers of precursors (optionally incorporating nanowires or other additives) can be formed over the precursor 602 with the embedded nanowires 600. The various precursor layers in a stack can be cured together once the stack is fully formed, or each additional precursor layer can be cured before a subsequent precursor layer is added to the stack.

Referring to the lower portion of FIG. 6, a resulting transparent conductor 608 includes the nanowires 600 localized within a "planar" or "planar-like" embedded region 610, which is adjacent to a top of the transparent conductive matrix 604 and is spaced apart from the substrate 606. Because the transparent conductive matrix 604 can provide electrical connections between adjacent nanowires 600, physical contact between adjacent nanowires 600 is not required. For example, the transparent conductor 608 can have desirable levels of electrical conductivity if the nanowires 600 are sufficiently closely spaced from one another, such as where a density of the nanowires 600 is such that the nanowires 600, on average, are no greater than about 500 nm apart, no greater than about 400 nm apart, no greater than about 300 nm apart, no greater than about 200 nm apart, no greater than about 100 nm apart, no greater than about 50 nm apart, or no greater than about 10 nm apart. Through surface embedding within the transparent conductive matrix 604, the nanowires 600 are protected from decomposition when exposed to high temperatures, thereby maintaining desired levels of electrical conductivity.

Figure 7:
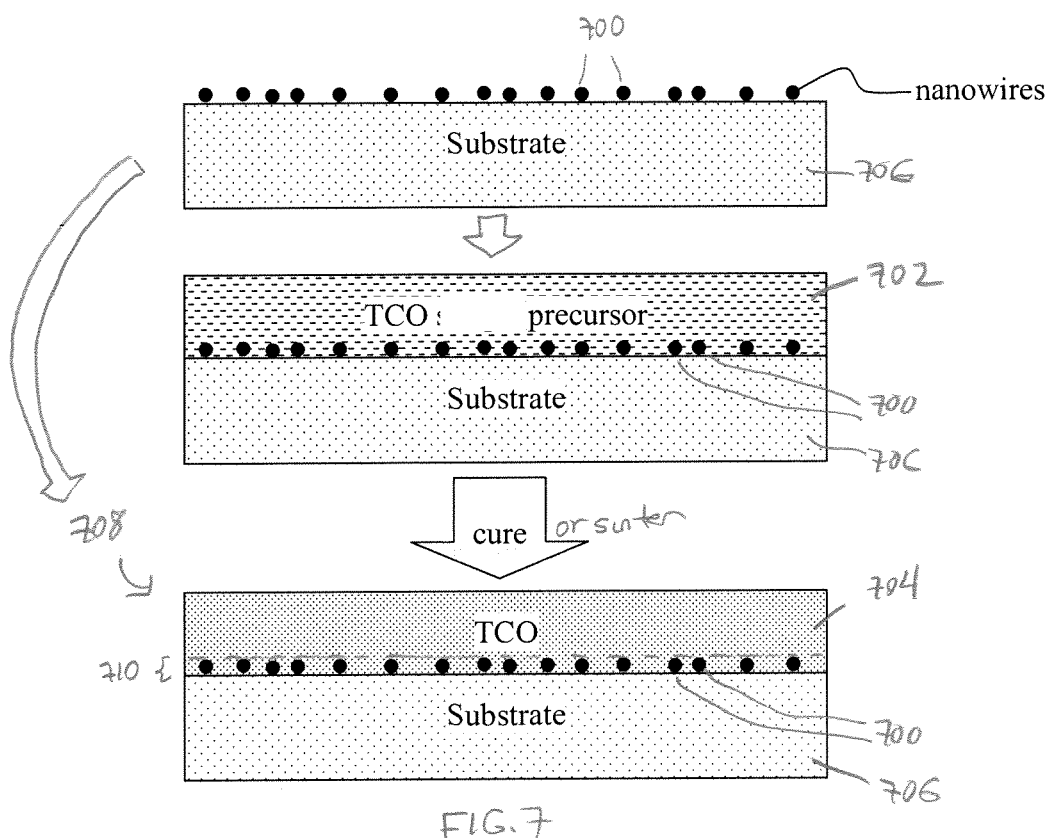

Another manufacturing method for incorporating additives into a transparent conductive matrix 704 is illustrated in FIG. 7. Specifically, the incorporation of additives in FIG. 7 is carried out through an over-coating operation. Referring to the upper portion of FIG. 7, nanowires 700 (e.g., silver nanowires) are applied over a substrate 706. Other types of electrically conductive or semiconducting additives can be used in place of, or in conjunction with, the nanowires 700. The nanowires 700 can be pre-formed and then applied over the substrate 706. Another option for applying the nanowires 700 is to synthesize the nanowires 700 over the substrate 706. The substrate 706 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 706 can serve as a temporary substrate that is subsequently removed during device assembly, or can be retained in a resulting device as a layer or other component of the device.

Optionally, the nanowires 700 can be at least partially embedded into the substrate 706. It is contemplated that an embedding fluid can be simultaneously or separately applied to the substrate 706 to facilitate the embedding of the nanowires 700. Certain aspects regarding the application and the embedding of the nanowires 700 into the substrate 706 can be carried out using similar processing conditions and materials as described above for FIG. 2A. In particular, and in at least certain aspects, the processing conditions for embedding the nanowires 700 into the substrate 706 can be viewed as largely parallel to those used when embedding the additives 202 into the dry composition 200 of FIG. 2A.

Next, as illustrated in the middle portion of FIG. 7, a precursor 702 of the transparent conductive matrix 704 is applied over the nanowires 700 and the substrate 606 as an over-coating by spraying, printing, rolling, gravure coating, slot-die coating, cup coating, blade coating, capillary coating, immersion, dip coating, or another suitable wet chemical process. The precursor 702 can include, for example, a sol-gel precursor of a metal oxide or chalcogenide, a dispersion of nanostructures of a metal oxide or chalcogenide, or a combination thereof. Examples of suitable materials for the precursor 702 are set forth above in connection with FIG. 5.

Next, as illustrated in the lower portion of FIG. 7, the precursor 702 (over-coating the nanowires 700) is cured, which can include a variety of thermal, chemical, or physical treatment to form the transparent conductive matrix 704 as a solid film, sheet, or layer with the nanowires 700 incorporated therein. Curing can include, for example, calcining, sintering, annealing, forming gas exposure, precursor gas exposure, ultraviolet exposure, infrared exposure, or any combination thereof. In the case of a dispersion of nanostructures of a conductive oxide or chalcogenide, curing can be carried out to at least partially coalesce, fuse, or merge the nanostructures, such as through annealing or sintering.

One or more additional layers of precursors (optionally incorporating nanowires or other additives) can be formed over the precursor 702 with the incorporated nanowires 700. The various precursor layers in a stack can be cured together once the stack is fully formed, or each additional precursor layer can be cured before a subsequent precursor layer is added to the stack.

Referring to the lower portion of FIG. 7, a resulting transparent conductor 708 includes the nanowires 700 localized within a "planar" or "planar-like" region 710, which is adjacent to a bottom of the transparent conductive matrix 704 and is adjacent to the substrate 706. Because the transparent conductive matrix 704 can provide electrical connections between adjacent nanowires 700, physical contact between adjacent nanowires 700 is not required. For example, the transparent conductor 708 can have desirable levels of electrical conductivity if the nanowires 700 are sufficiently closely spaced from one another, such as where a density of the nanowires 700 is such that the nanowires 700, on average, are no greater than about 500 nm apart, no greater than about 400 nm apart, no greater than about 300 nm apart, no greater than about 200 nm apart, no greater than about 100 nm apart, no greater than about 50 nm apart, or no greater than about 10 nm apart. Because physical contact between adjacent nanowires 700 is not required for electrical conductivity, the nanowires 700 can be more sparsely distributed across the substrate 706, thereby mitigating against a tendency of the nanowires 700 to overlie or stack upon one another that can impede infiltration of the nanowires 700 by the precursor 702. In such fashion, the presence of gaps or voids arising from inadequate infiltration can be reduced to yield improved performance characteristics. Also, through incorporation within the transparent conductive matrix 704, the nanowires 700 are protected from decomposition when exposed to high temperatures, thereby maintaining desired levels of electrical conductivity.

It is noted that, in some implementations, the transparent conductive matrix 704 can be formed over the nanowires 700 without having to apply the precursor 702 over the nanowires 700. For example, a conductive oxide can be applied by a deposition technique (e.g., physical vapor deposition) over the nanowires 700 after the nanowires 700 have been applied to the surface of the substrate 706. Alternatively, the precursor 702 can be formed by a deposition technique and subsequently annealed to form the transparent conductive matrix 704.

Figure 8:
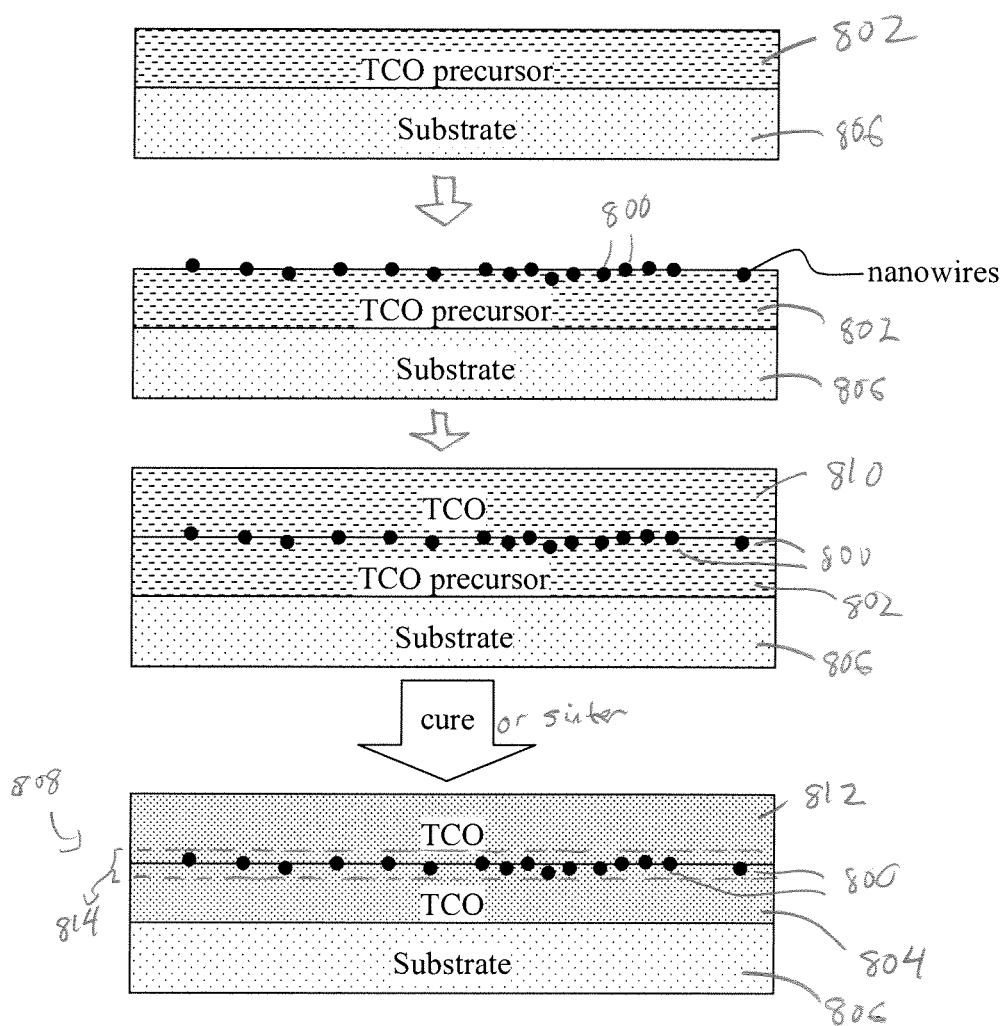

Another manufacturing method for incorporating additives into a transparent conductor 808 is illustrated in FIG. 8. Specifically, the incorporation of additives in FIG. 8 can be viewed as a hybrid of the manufacturing methods illustrated in FIG. 6 and FIG. 7.

Referring to the upper portion of FIG. 8, a precursor 802 of a transparent conductive matrix 804 is applied over a substrate 806 as a coating by spraying, printing, rolling, gravure coating, slot-die coating, cup coating, blade coating, capillary coating, immersion, dip coating, or another suitable wet chemical process. The precursor 802 can include, for example, a sol-gel precursor of a metal oxide or chalcogenide, a dispersion of nanostructures of a metal oxide or chalcogenide, or a combination thereof. Examples of suitable materials for the precursor 802 are set forth above in connection with FIG. 5. The substrate 806 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, ceramic, glass, silicon, metal (e.g., stainless steel or aluminum), or any combination thereof, as well as any other material previously listed as suitable host materials. The substrate 806 can serve as a temporary substrate that is subsequently removed during device assembly, or can be retained in a resulting device as a layer or other component of the device.

Next, nanowires 800 (e.g., silver nanowires) are applied to the precursor 802, as illustrated in the middle portion of FIG. 8. For example, the nanowires 800 can be mixed with a solvent, such as ethanol, 2-propanol, ethylene glycol, methanol, toluene, methyl ethyl ketone, trifluoroethanol, tetrafluoropropanol, cyclohexanone, and the like, and the nanowire/solvent mixture can be applied to the precursor 802, which can include the same or a different solvent. Other types of electrically conductive or semiconducting additives can be used in place of, or in conjunction with, the nanowires 800. The nanowires 800 are applied to the precursor 802 prior to drying or curing (e.g., fully drying or fully curing) or while it remains in a state that permits embedding of the nanowires 800 within the precursor 802. It is contemplated that an embedding fluid can be simultaneously or separately applied to the precursor 802 to facilitate the embedding of the nanowires 800. Subsequently, the precursor 802 has at least some of the nanowires 800 partially or fully embedded into a surface of the precursor 802. Certain aspects regarding the application and the embedding of the nanowires 800 in FIG. 8 can be carried out using similar processing conditions and materials as described above for FIG. 2C. In particular, and in at least certain aspects, the processing conditions for embedding the nanowires 800 into the precursor 802 of FIG. 8 can be viewed as largely parallel to those used when embedding the additives 222 into the wet composition 218 of FIG. 2C.

Another option for embedding the nanowires 800 is to synthesize the nanowires 800 over the precursor 802. The nanowires 800 can be partially or fully embedded into a surface of the precursor 802 during or subsequent to their synthesis.

Optionally, the precursor 802 can be at least partially dried or cured prior to application of the nanowires 800. Drying or curing of the precursor 802 can be carried out to an extent such that the nanowires 800 remain on a surface of the precursor 802, with little or no embedding into the precursor 802.

Next, as illustrated in the middle portion of FIG. 8, a precursor 810 of a transparent conductive matrix 812 is applied over the nanowires 800 and the precursor 802 as an over-coating by spraying, printing, rolling, gravure coating, slot-die coating, cup coating, blade coating, capillary coating, immersion, dip coating, or another suitable wet chemical process. The precursor 810 can include, for example, a sol-gel precursor of a metal oxide or chalcogenide, a dispersion of nanostructures of a metal oxide or chalcogenide, or a combination thereof. Examples of suitable materials for the precursor 810 are set forth above in connection with FIG. 5. The precursor 810 can have the same or similar composition as the precursor 802, or can differ in some fashion.

Next, as illustrated in the lower portion of FIG. 8, the precursors 802 and 810 are cured, which can include a variety of thermal, chemical, or physical treatment to form the transparent conductive matrices 804 and 812 as a stack of solid films, sheets, or layers with the nanowires 800 incorporated therein. Curing can include, for example, calcining, sintering, annealing, forming gas exposure, precursor gas exposure, ultraviolet exposure, infrared exposure, or any combination thereof. In the case of a dispersion of nanostructures of a conductive oxide or chalcogenide, curing can be carried out to at least partially coalesce, fuse, or merge the nanostructures, such as through annealing or sintering.

One or more additional layers of precursors (optionally incorporating nanowires or other additives) can be formed over the precursor 810. The various precursor layers in a stack can be cured together once the stack is fully formed, or each additional precursor layer can be cured before a subsequent precursor layer is added to the stack.

Referring to the lower portion of FIG. 8, the resulting transparent conductor 808 includes the nanowires 800 incorporated between the transparent conductive matrices 804 and 812 and localized within a "planar" or "planar-like" region

814, which is spaced apart from the substrate 806 and at least partially extends above into the transparent conductive matrix 812 and below into the transparent conductive matrix 804. It is also contemplated that the nanowires 800 can be substantially or fully localized within one of the transparent conductive matrices 804 and 812. It is further contemplated that the nanowires 800 can be incorporated as a distinct layer between the transparent conductive matrices 804 and 812. Because the transparent conductive matrices 804 and 812 can provide electrical connections between adjacent nanowires 800, physical contact between adjacent nanowires 800 is not required. For example, the transparent conductor 808 can have desirable levels of electrical conductivity if the nanowires 800 are sufficiently closely spaced from one another, such as where a density of the nanowires 800 is such that the nanowires 800, on average, are no greater than about 500 nm apart, no greater than about 400 nm apart, no greater than about 300 nm apart, no greater than about 200 nm apart, no greater than about 100 nm apart, no greater than about 50 nm apart, or no greater than about 10 nm apart. Through incorporation within the transparent conductive matrices 804 and 812, the nanowires 800 are protected from decomposition when exposed to high temperatures, thereby maintaining desired levels of electrical conductivity.

It is noted that, in some implementations, one or more of the transparent conductive matrices 804 and 812 can be formed without having to apply corresponding precursors 802 and 810. For example, the transparent conductive matrix 804 can be a conductive oxide formed by physical vapor deposition (or another deposition technique) over the surface of the substrate 806. The nanowires 800 then can be applied to the surface of the transparent conductive matrix 804. Alternatively, the precursor 802 can be formed by a deposition technique and subsequently annealed to form the transparent conductive matrix 804. Similarly, the transparent conductive matrix 812 can be formed over the nanowires 800 by physical vapor deposition (or another deposition technique), or the precursor 810 can be formed by a deposition technique, and the transparent conductive matrix 812 can be formed by annealing the precursor 810. It is noted that, in certain implementations, one or both of the transparent conductive matrices 804 and 812 can be formed using physical vapor deposition, chemical vapor deposition, atomic layer deposition, spray coating, lamination, or other techniques. Alternatively, combinations of these techniques can be used in conjunction with formation of one of the transparent conductive matrices 804 and 812 using a wet chemical process. For example, one of the two transparent conductive matrices 804 and 812 can be formed by physical vapor deposition, and the other can be formed using a wet chemical process.

Also, instead of applying the precursor 810, an over-coating operation similar to that described with reference to FIG. 4A through FIG. 4C can be performed over the nanowires 800, either before and after curing the precursor 802. For example, an over-coating can be composed of a ceramic material (e.g., a dielectric ceramic material), an electrically conductive material, a semiconducting material, or any combination thereof. Other aspects of such an over-coating are described above with reference to FIG. 4A through FIG. 4C, and those aspects are not repeated.

Advantageously, the transparent conductors 508, 608, 708, and 808 of FIG. 5 through FIG. 8, which are formed using conductive additives, can provide levels of electrical conductivity and transparency at least comparable, if not superior, to conductive oxide films formed without such additives, either by a wet chemical process or by a dry process. Suitable values for electrical conductivity (in terms of sheet resistance) and transparency (in terms of transmittance) are set forth above in the overview section for transparent conductors. For example, at a transmittance of about 85% or greater (e.g., solar flux-weighted transmittance or one measured at another range of optical wavelengths), a sheet resistance can be no greater than about 500 $\Omega$/sq, no greater than about 400 $\Omega$/sq, no greater than about 350 $\Omega$/sq, no greater than about 300 $\Omega$/sq, no greater than about 200 $\Omega$/sq, no greater than about 100 $\Omega$/sq, no greater than about 75 $\Omega$/sq, no greater than about 50 $\Omega$/sq, no greater than about 25 $\Omega$/sq, no greater than about 15 $\Omega$/sq, no greater than about 10 $\Omega$/sq, and down to about 1 $\Omega$/sq or about 0.1 $\Omega$/sq, or less. Such a low sheet resistance can be attained through a synergistic interaction between the nanowires 500, 600, 700, and 800 and the transparent conductive matrices 504, 604, 704, 804, and 812 even though an intrinsic sheet resistance of the transparent conductive matrices 504, 604, 704, 804, and 812 (i.e., sheet resistances of matrices 504, 604, 704, 804, and 812 in the absence of the nanowires 500, 600, 700, and 800) can be at least about 800 $\Omega$/sq, at least about 1 K $\Omega$/sq, at least about 1.5 K $\Omega$/sq, or at least about 2 K $\Omega$/sq, and up to about 10 k$\Omega$/sq or more. Stated in another way, an overall or effective sheet resistance of the transparent conductors 508, 608, 708, and 808 can be no greater than m times the intrinsic sheet resistance of the transparent conductive matrices 504, 604, 704, 804, and 812, where m can be about 1, about $\frac{1}{2}$, about $\frac{1}{5}$, about $\frac{1}{10}$, about $\frac{1}{20}$, about $\frac{1}{30}$, about $\frac{1}{40}$, about $\frac{1}{50}$, about $\frac{1}{60}$, about $\frac{1}{70}$, about $\frac{1}{80}$, about $\frac{1}{90}$, or about $\frac{1}{100}$.

Processing parameters and other considerations for embedding or otherwise incorporating additives are set forth above for some embodiments of the invention. The following lists some additional non-limiting considerations for engineering precursors of conductive oxides or chalcogenides and their corresponding coating formulations of some embodiments:

(1) Nanowires or other additives should be compatible and stable with a precursor to facilitate incorporation of the additives. The level of compatibility, for example, can be correlated with, for instance, Hansen solubility parameters and other interaction parameters between a liquid dispersion of the additives and the precursor. The level of compatibility also can be correlated to solvation or swelling capability of a liquid dispersion of the additives. In the case of incorporating additives into a dispersion of nanostructures of a conductive oxide or chalcogenide, relevant considerations for a liquid dispersion of the additives can include, for example, size of the nanostructures and capillary forces/wettability of the nanostructures.

(2) A liquid-deposited formulation should have adequately small contact angles with a substrate to promote wettability. This can be addressed with wetting agents, surface treating the substrate, or both.

(3) The liquid-deposited formulation should have adequate durability under relevant industrial conditions. This can be enhanced with the addition of one or more stabilizers.

(4) Drying and heating processes can be executed in a manner to obtain repeatable homogenous coatings.

Devices Including Transparent Conductors

The transparent conductors described herein can be used as transparent conductive electrodes in a variety of devices. Examples of suitable devices include solar cells (e.g., thin-film solar cells and crystalline silicon solar cells), display devices (e.g., flat panel displays, liquid crystal displays ("LCDs"), plasma displays, organic light emitting diode ("OLED") displays, electronic-paper ("e-paper"), quantum dot displays, and flexible displays), solid-state lighting devices (e.g., OLED lighting devices), touch screen devices (e.g., projected capacitive touch screen devices, touch-on-lens projected capacitive touch screen devices, on-cell or in-cell projected capacitive touch screen devices, self capacitive touch screen devices, surface capacitive touch screen devices, and resistive touch screen devices), smart windows (or other windows), windshields, aerospace transparencies, electromagnetic interference shields, charge dissipation shields, and anti-static shields, as well as other electronic, optical, optoelectronic, quantum, photovoltaic, and plasmonic devices. The transparent conductors can be tuned or optimized depending on the particular application, such as work function matching in the context of photovoltaic devices or tuning of the transparent conductors to form Ohmic contacts with other device components or layers.

Figure 9:
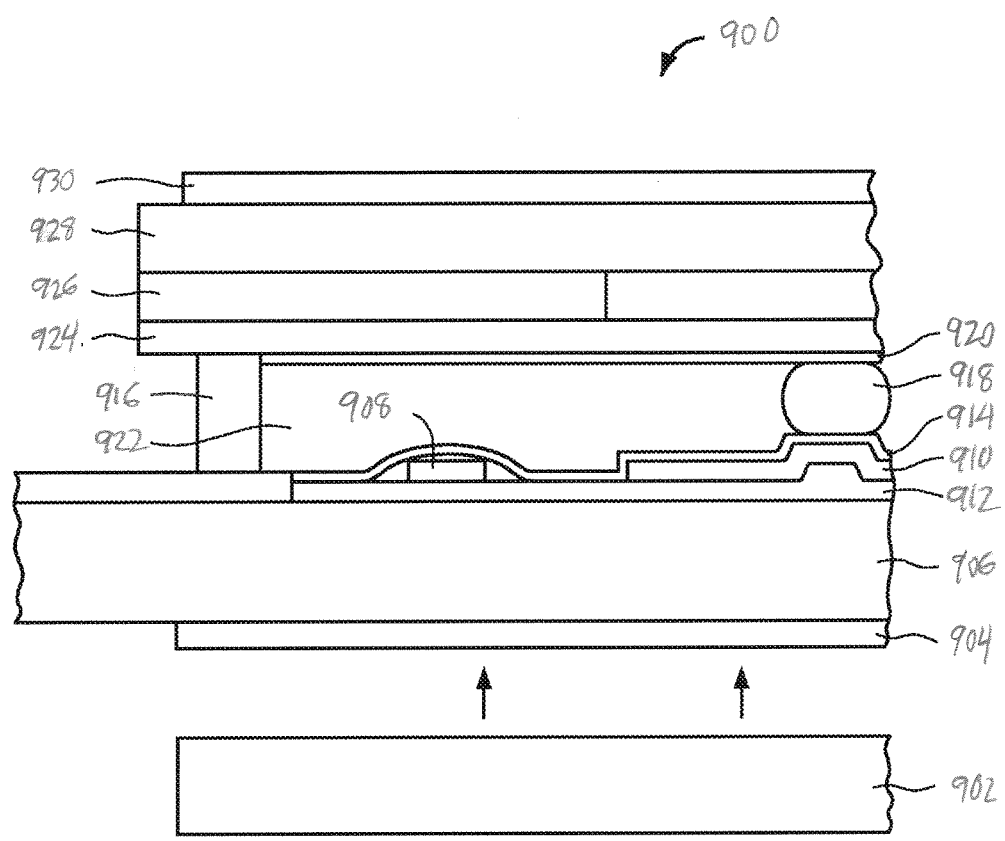
FIG. 9 illustrates a LCD according to an embodiment of the invention.

In some embodiments, the transparent conductors can be used as electrodes in LCDs. FIG. 9 illustrates an example of a LCD 900 according to an embodiment of the invention. A backlight module 902 projects light through a thin-film transistor ("TFT") substrate 906 and a bottom polarizer 904, which is disposed adjacent to a bottom surface of the TFT substrate 906. A TFT 908, a pixel electrode 910, and a storage capacitor 912 are disposed adjacent to a top surface of the TFT substrate 906 and between the TFT substrate 906 and a first alignment layer 914. A seal 916 and a spacer 918 are provided between the first alignment layer 914 and a second alignment layer 920, which sandwich liquid crystals 922 in between. A common electrode 924 and color matrices 926 are disposed adjacent to a bottom surface of a color filter substrate 928 and between the color filter substrate 928 and the second alignment layer 920. As illustrated in FIG. 9, a top polarizer 930 is disposed adjacent to a top surface of the color filter substrate 928. Advantageously, either, or both, of the electrodes 910 and 924 can be implemented using the transparent conductors described herein.

Figure 10:
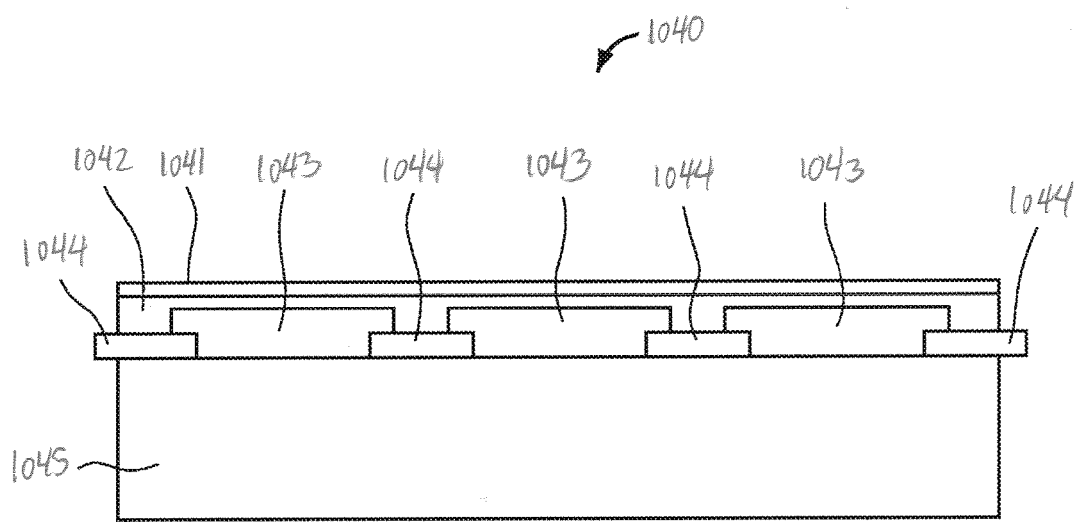
FIG. 10 illustrates a color filter for use in an LCD according to an embodiment of the invention.

In some embodiments, the transparent conductors can be used as common electrodes in color filter plates, which are used in LCDs. FIG. 10 illustrates a color filter 1040 for use in an LCD according to an embodiment of the invention. A common electrode 1041 is disposed adjacent to an overcoat/protective layer 1042, which is deposited adjacent to Red, Green, and Blue ("RGB") color matrices 1043, which is adjacent to a black matrix 1044, which are all disposed on a glass substrate 1045. The overcoat/protective layer 1042 can include, for example, an acryl resin, a polyimide resin, a polyurethane resin, epoxy, or any combination thereof, and can be used to planarize a topography of the RGB color matrices 1043 and the black matrix 1044. In other embodiments, the overcoat/protective layer 1042 can conform to the topology of the RGB color matrices 1043 and the black matrix 1044. In other embodiments, the overcoat/protective layer 1042 can be omitted. In some embodiments, the black matrix 1044 can be made to be electrically conductive, and can form electrical contact with the common electrode 1041; in such embodiments, the black matrix 1044 can be viewed as a busbar for the common electrode 1041. Advantageously, the common electrode 1041 can be implemented using the transparent conductors described herein.

In other embodiments, the transparent conductors can be used as electrodes in photovoltaic devices, such as solar cells. During operation of a photovoltaic device, light is absorbed by a photoactive material to produce charge carriers in the form of electron-hole pairs. Electrons exit the photoactive material through one electrode, while holes exit the photoactive material through another electrode. The net effect is a flow of an electric current through the solar cell driven by incident light, which electric current can be delivered to an external load to perform useful work.

Figure 11:
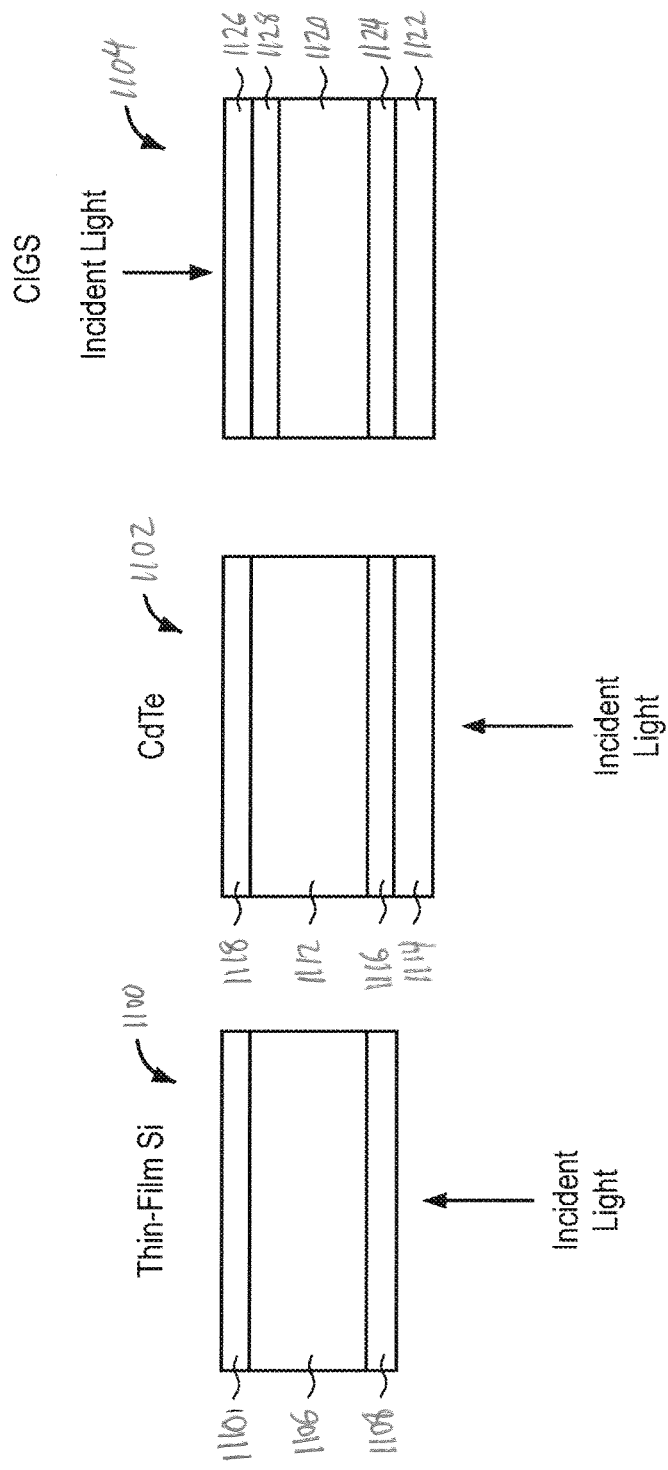
FIG. 11 illustrates thin-film solar cells according to an embodiment of the invention.

FIG. 11 illustrates examples of thin-film solar cells 1100, 1102, and 1104 according to an embodiment of the invention. In particular, the thin-film solar cell 1100 corresponds to a thin-film silicon solar cell, in which a photoactive layer 1106 formed of silicon is disposed between a transparent conductive electrode 1108 and a back electrode 1110. Referring to FIG. 11, the thin-film solar cell 1102 corresponds to a CdTe solar cell, in which a photoactive layer 1112 formed of CdTe is disposed between a transparent conductive electrode 1114 and a back electrode 1118, and a barrier layer 1116 is disposed between the photoactive layer 1112 and the transparent conductive electrode 1114. And, the thin-film solar cell 1104 corresponds to a CIGS solar cell, in which a photoactive layer 1120 formed of CIGS is disposed between a transparent conductive electrode 1126 and a back electrode 1124, and a barrier layer 1128 is disposed between the photoactive layer 1120 and the transparent conductive electrode 1126. The various layers of the thin-film solar cell 1104 are disposed on top of a substrate 1122, which can be rigid. Advantageously, the transparent conductive electrodes 1108, 1114, and 1126 can be implemented using the transparent conductors described herein. For example, in the case of the CdTe solar cell 1102, the transparent conductive electrode 1114 can serve as a superstrate for deposition of a window layer composed of cadmium sulfide as well as other device layers. In some embodiments, an over-coating can be used to tune the properties of a transparent conductive electrode, for instance, a work function. In other embodiments, mild abrasion can be used to break an over-coating that is present and expose underlying nanowires or other additives. It is also contemplated that the back electrodes 1110, 1118, and 1124 can be similarly implemented as the transparent conductive electrodes 1108, 1114, and 1126. It is further contemplated that transparent conductors can be used in crystalline, polycrystalline, single crystalline, or amorphous silicon solar cells. It is further contemplated that by, using the transparent conductors discussed herein, fewer, thinner, more widely spaced, busbars, or a combination thereof, can be used, which can increase the performance of a solar cell by, for instance, decreasing the amount of light blocked by the busbars. In another embodiment, the transparent conductors described herein, can be used to help boost the performance of a solar cell by, for instance, increasing the amount of light available to the solar cell, increasing absorption of light into the solar cell, or a combination thereof.

In other embodiments, the transparent conductors can be used as electrodes in touch screen devices. A touch screen device is typically implemented as an interactive input device integrated with a display, which allows a user to provide inputs by contacting a touch screen. The touch screen is typically transparent to allow light and images to transmit through the device.

Figure 12:
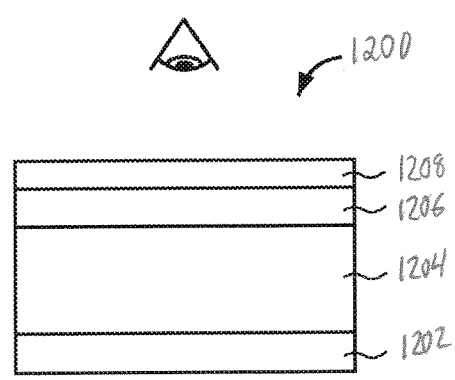
FIG. 12 illustrates a projected capacitive touch screen device according to an embodiment of the invention.

FIG. 12 illustrates an example of a projected capacitive touch screen device 1200 according to an embodiment of the invention. The touch screen device 1200 includes a thin-film separator 1204 that is disposed between a pair of patterned transparent conductive electrodes 1202 and 1206, as well as a rigid touch screen 1208 that is disposed adjacent to a top surface of the transparent conductive electrode 1208. A change in capacitance occurs when a user contacts the touch screen 1208, and a controller (not illustrated) senses the change and resolves a coordinate of the user contact. Advantageously, either, or both, of the transparent conductive electrodes 1202 and 1206 can be implemented using the transparent conductors described herein. It is also contemplated that the transparent conductors can be included in resistive touch screen devices (e.g., 4-wire, 5-wire, and 8-wire resistive touch screen devices), which include a flexible touch screen and operate based on electrical contact between a pair of transparent conductive electrodes when a user presses the flexible touch screen.

Figure 13:
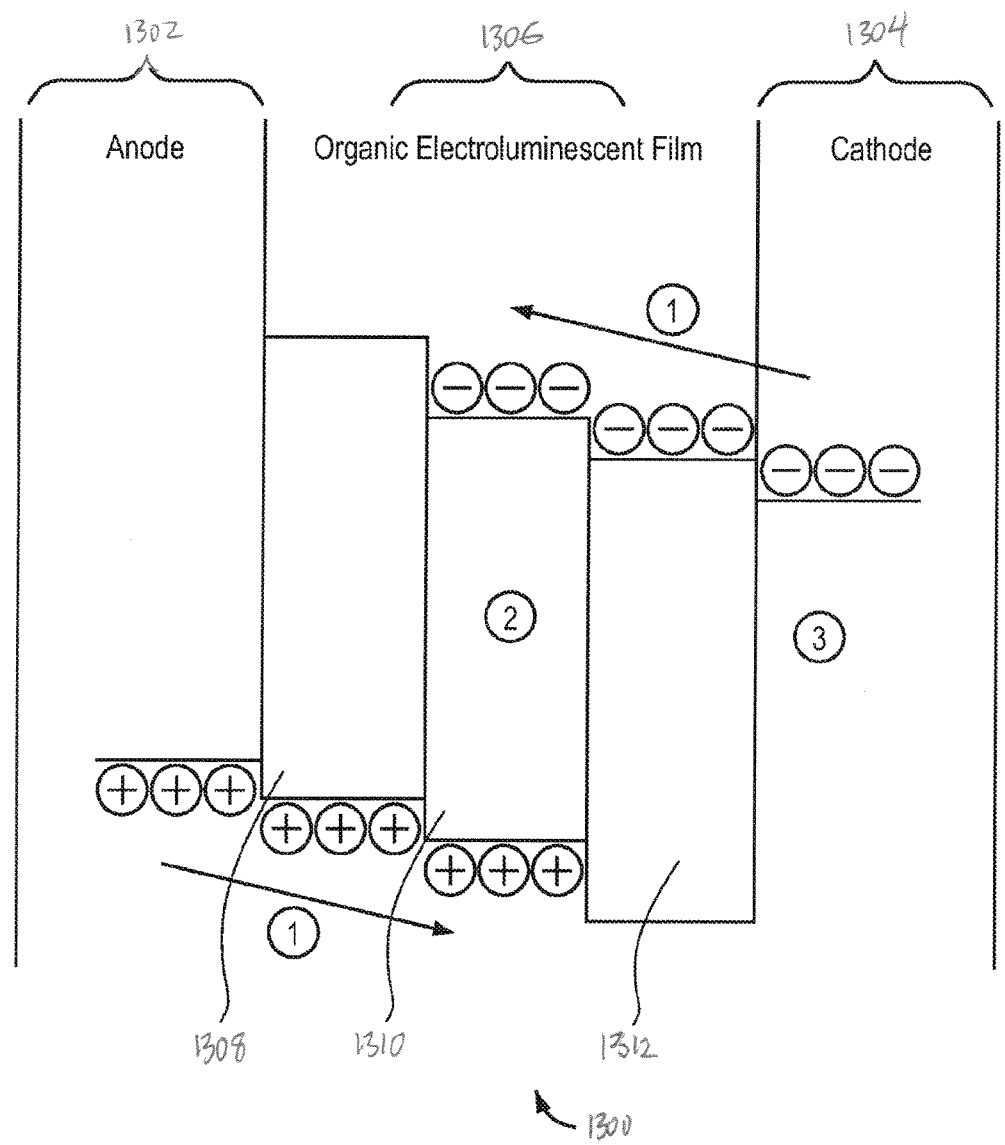
FIG. 13 illustrates an OLED lighting device according to an embodiment of the invention.

In other embodiments, the transparent conductors can be used as electrodes in solid-state lighting devices. FIG. 13 illustrates an example of an OLED lighting device 1300 according to an embodiment of the invention. The OLED device 1300 includes an organic electroluminescent film 1306, which includes a Hole Transport Layer ("HTL") 1308, an Emissive Layer ("EML") 1310, and an Electron Transport Layer ("ETL") 1312. Two electrodes, namely an anode 1302 and a cathode 1304, are disposed on either side of the film 1306. When a voltage is applied to the electrodes 1302 and 1304, electrons (from the cathode D04) and holes (from the anode D02) pass into the film 1306 (stage 1). The electrons and holes recombine in the presence of light-emitting molecules within the EML 1310 (stage 2), and light is emitted (stage 3) and exits through the cathode 1304. Advantageously, either, or both, of the electrodes 1302 and 1304 can be implemented using the transparent conductors described herein. It is also contemplated that the transparent conductors can be included in OLED displays, which can be implemented in a similar fashion as illustrated in FIG. 13.

Figure 14:
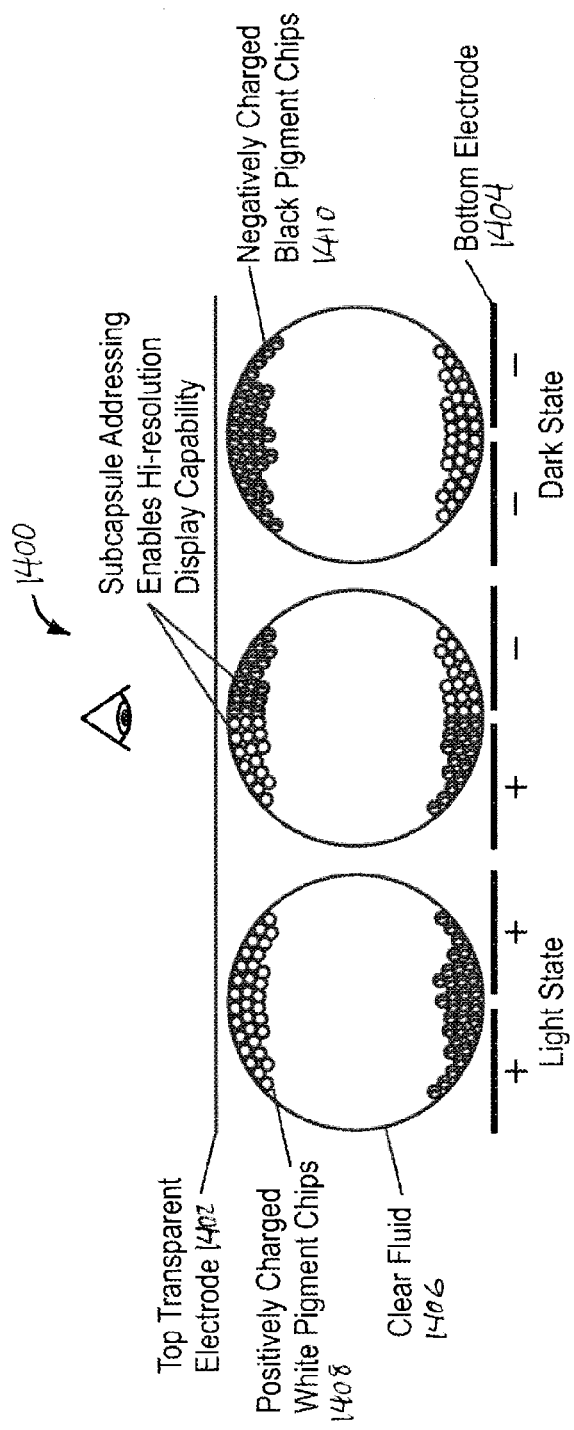
FIG. 14 illustrates an e-paper according to an embodiment of the invention.

In other embodiments, the transparent conductors can be used as electrodes in e-paper. FIG. 14 illustrates an example of an e-paper 1400 according to an embodiment of the invention. The e-paper 1400 includes a transparent conductive electrode 1402 and a bottom electrode 1404, between which are positively charged white pigments 1408 and negatively charged black pigments 1410 dispersed in a carrier medium 1406. When a "negative" electric field is applied, the black pigments 1410 move towards the bottom electrode 1404, while the white pigments 1408 move towards the top transparent conductive electrode 1402, thereby rendering that portion of the e-paper 1400 to appear white. When the electric field is reversed, the black pigments 1410 move towards the top transparent conductive electrode 1402, thereby rendering that portion of the e-paper 1400 to appear dark. Advantageously, either, or both, of the electrodes 1402 and 1404 can be implemented using the transparent conductors described herein.

Figure 15:
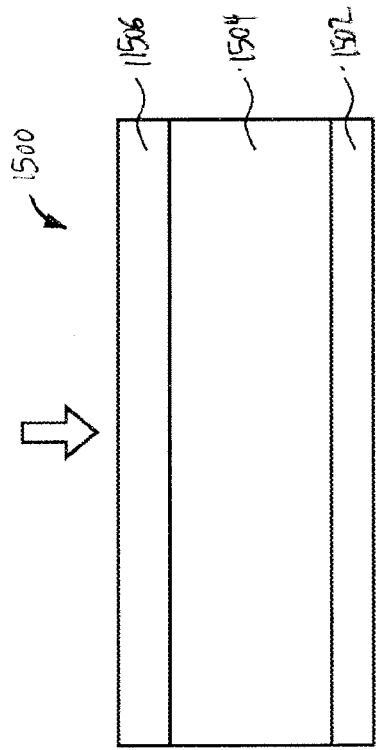
FIG. 15 illustrates a smart window according to an embodiment of the invention.

In still further embodiments, the transparent conductors can be used as electrodes in smart windows. FIG. 15 illustrates an example of a smart window 1500 according to an embodiment of the invention. The smart window 1500 includes a pair of transparent conductive electrodes 1502 and 1506, between which is an active layer 1504 that controls passage of light through the smart window 1500. In the illustrated embodiment, the active layer 1504 includes liquid crystals, although the active layer 1504 also can be implemented using suspended particles or electrochromic materials. When an electric field is applied, the liquid crystals respond by aligning with respect to the electric field, thereby allowing the passage of light. When the electrical field is absent, the liquid crystals become randomly oriented, thereby inhibiting the passage of light. In such manner, the smart window 1500 can appear transparent or translucent. Advantageously, either, or both, of the electrodes 1502 and 1506 can be implemented using the transparent conductors described herein. Additionally, it is contemplated that the increased smoothness of a transparent conductor described herein (e.g., due to the localization of additives into a "planar" embedded region) can decrease a haze compared to other conventional structures.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation and Characterization of Transparent Conductor

A spin-on glass ("SOG") solution is formed by diluting a commercially available SOG (Flextronics SOG 20B) in a ratio of about 1 part SOG to about 1.5 parts water. The SOG solution is coated onto a cleaned soda lime glass substrate with a blade applicator (e.g., a U-coater with 0.0005" gap) to form an SOG coating. The glass substrate can be cleaned using a solution of a suitable detergent and de-ionized water. By way of example, a solution of about 2% Micro 90 detergent and about 98% de-ionized water can be used. The glass substrate can be cleaned with this solution using a sponge, rinsed in isopropanol, and then dried using an air knife. The SOG coating can be partially cured ("A-staged") at about 80° C. for about 5 minutes in an oven. Next, a dispersion of nanowires (e.g., 2.5 mg/mL, 60 nm average diameter silver nanowires, commercially available from Blue Nano North America of Corneilius, N.C. as part number SLV-NW-60) in ethanol is coated on top of the A-staged SOG coating, such as using a blade coating technique, resulting in embedding of the silver nanowires into the SOG coating. A tetraethoxysilane ("TEOS") precursor solution (about 0.01 M to about 0.02 M) is applied over the A-staged SOG coating with embedded nanowires using a 0.0005" gap U-coater. The glass-SOG-nanowire-TEOS composite is then cured for about 60 minutes at about 70° C. in an HCl environment of about 1 mmole/cm$^3$. Alternatively, curing can be done in ambient conditions or shorter time durations (e.g., a few minutes) at a temperature greater than about 40° C. Processing parameters that can be adjusted to obtain a desired coating thickness include a concentration of the reagents, a distance between the coating applicator blade and the substrate, or both.

A transparent conductor was formed according to the above-described procedure, and yielded a surface conductivity of about 90 Ω/sq by probing. The transparent conductor was found to be mechanically robust in that the nanowires were not removed by abrasion. Furthermore, the transparent conductor, incorporating the nanowires, was thermally stable to at least about 550° C.

Example 2

Formation of Transparent Conductor

Indium tin oxide ("ITO") nanoparticles are synthesized via precipitation of $InCl_3$ and $SnCl_4.5H_2O$ (8 at. %), followed by drying and forming gas treatment at about 350° C., redispersal in 3,6,9-trioxadecanoic acid as a surfactant, mixed with a binder of pre-hydrolyzed 3-methacryloxypropyl-trimethoxysilane for polymerization, bis[2,4,6-trimethylbenzoyl]phenyl triphosphine oxide as a photoinitiator, and 1-propanol as the principal solvent to obtain a dispersion including about 50 wt. % ITO. Silver nanowires suspended in 1-propanol are then mixed into the dispersion at about 5 mg/ml concentration. The ITO nanoparticles/silver nanowires dispersion is gravure printed or slot-die coated onto a glass substrate, and the ITO nanoparticles and silver nanowires can be sintered at about 500° C. for about 1 hour and fused together to form a solid film. The film incorporating the silver nanowires has a lower sheet resistance for a given transmittance of the film.

Example 3

Formation of Transparent Conductor

About 0.40 mmol of indium acetate (99.99%), about 0.55 mL of oleylamine (70%), and about 0.60 mL of oleic acid (90%) are mixed with about 7.0 mL of hexadecane (>99% purity) in a flask at about 110° C., and then trimethylamine N-oxide is stirred into the solution under argon. Ethanol precipitates the solution, and, after centrifugation purification, a redispersion is carried out in isopropanol. This synthesis yields substantially monodisperse, indium oxide nanoparticles of about 11 nm in diameter. A dispersion of silver nanowires in isopropanol is then mixed into the colloid at about 1 mg/ml concentration. This dispersion is then blade coated on a glass substrate at about 3 inches/s with a blade gap size of about 1 mil, yielding a film of indium oxide with silver nanowires bulk incorporated therein. This film is then calcined at about 600° C. to yield a solidified film that is conductive and transparent.

Example 4

Formation of Transparent Conductor

A slurry of ITO nanoparticle precursors, $In(acac)_3$ and $Sn(acac)_2Cl_2$ in oleylamine, is heated at about 250° C. for about 5 hours in argon. Ethanol is added to precipitate the nanoparticles, followed by repeated washing and centrifugation for purification. The ITO nanoparticles are redispersed in a suitable organic solvent for coating or embedding, such as ethanol. Silver nanowires in ethanol are then mixed into this colloid at a concentration of about 2 mg/ml. The dispersion is then slot-die coated onto a glass substrate. The coating with bulk incorporated silver nanowires is then thermally annealed, and processing parameters can be adjusted to tune properties of the resulting film. For example, a ratio of the metal precursors (e.g., 5:95 for Sn:In ratio) to oleylamine can be varied to yield different sized ITO nanoparticles (e.g., 7 nm diameter). Techniques can be used to arrange the ITO nanoparticles into various crystalline or amorphous configurations, such as close-packed superlattice structures. Seed-mediated growth of ITO nanoparticles also can be used to yield larger nanoparticles.

Example 5

Formation of Transparent Conductor $Al(NO_3)_3.9H_2O$ is added to 0.1 M zinc nitrate hexahydrate stabilized with ethylene glycol in de-ionized water. The aluminum source can be varied between a range of about 5-9 at. % to yield various amounts of doping levels. Stirring can occur at about 80° C. for about 1 hour while citric acid is dropped into the solution gradually until the solution becomes transparent. Afterwards, the solution is heated at about 120° C. for solvent evaporation, with the remainder ball milled into nanoparticles and then oxidized in a furnace at about 700-800° C. The resulting powder is suspended in butanol, mixed with silver nanowires at a concentration of about 3 mg/ml, and then screen printed onto a glass substrate. The coating is calcined in a furnace at about 600° C. to sinter the nanoparticles and nanowires together to form a solid film.

Example 6

Formation of Transparent Conductor

A transparent conductor is formed according to the following procedure:
(1) Prepare 0.1 M ethanol solution of zinc acetate and aluminum nitrate such that a molar ratio of Zn/(Zn+Al) is about 0.009.
(2) Blade coat about 2.5 mg/mL solution of silver nanowires (Bluenano, 30-60 nm diameter) onto a clean glass substrate using about 0.00075" gap at about 3.0 in/s.
(3) Overcoat ZnO:Al sol gel using about 0.001" gap at about 2.5 in/s.
(4) Dry in oven at about 110° C. for about 15 minutes.
(5) Overcoat ZnO:Al sol gel using about 0.00125" gap at about 2.5 in/s.
(6) Dry in oven at about 150° C. for about 10 minutes.
(7) Heat in furnace at about 550° C. for about 30 minutes.

Example 7

Formation of Transparent Conductor

Indium tin oxide nanoparticles are synthesized via precipitation of $InCl_3$ and $SnCl_4.5H_2O$ (8 at. %), followed by drying and forming gas treatment at about 350° C., redispersal in 3,6,9-trioxadecanoic acid as a surfactant, mixed with a binder of pre-hydrolyzed 3-methacryloxypropyl-trimethoxysilane for polymerization, bis[2,4,6-trimethylbenzoyl]phenyl triphosphine oxide as a photoinitiator, and 1-propanol as the principal solvent to obtain a dispersion including about 50 wt. % ITO. The dispersion of ITO nanoparticles is gravure printed or coated onto a substrate. After coating the ITO nanoparticles and binder slurry out of the 1-propanol solvent, silver nanowires or other conductive nanostructures are then coated over the ITO nanoparticles-binder film, where the silver nanowires or other conductive nanostructures are suspended in ethanol, methanol, isopropanol, or another alcohol that permits at least partial embedding of the conductive nanostructures.

After coating the ITO nanoparticles without the inclusion of additional conductive nanostructures, the binder cures upon UV irradiation, the sheet resistance falls from about 1,000 Ohms/sq to about 500 Ohms/sq, and subsequent forming gas annealing yields about 80% transmittance for the ITO nanoparticle film. The ITO nanoparticles can be sintered or otherwise fused together to form a solid film, where conductive nanostructures can be embedded therein. It is expected that the fused ITO film with at least partially embedded conductive nanostructures, such as silver nanowires, will have a lower sheet resistance for a given transmittance of the film.

Example 8

Formation of Transparent Conductor

About 0.40 mmol of indium acetate (99.99%), about 0.55 mL of oleylamine (70%), and about 0.60 mL of oleic acid (90%) are mixed with about 7.0 mL of hexadecane (>99% purity) in a flask at about 110° C., and then trimethylamine N-oxide is stirred into the solution under argon. Ethanol precipitates the solution, and, after centrifugation purification, a redispersion is carried out in isopropanol. This synthesis yields substantially monodisperse, indium oxide nanoparticles of about 11 nm in diameter. This dispersion is then blade coated on a glass substrate at about 3 inches/s with a blade gap size of about 1 mil, and then a dispersion of silver nanowires in isopropanol of about 1 mg/ml concentration is blade coated with the same conditions, yielding a film of indium oxide with silver nanowires embedded therein. This film is then calcined at about 600° C. to yield a solidified film that is conductive and transparent.

Example 9

Formation of Transparent Conductor

A slurry of ITO nanoparticle precursors, In(acac)$_3$ and Sn(acac)$_2$Cl$_2$ in oleylamine, is heated at about 250° C. for about 5 hours in argon. Ethanol is added to precipitate the nanoparticles, followed by repeated washing and centrifugation for purification. The ITO nanoparticles are redispersed in a suitable organic solvent for coating or embedding, such as ethanol. The ITO nanoparticles are coated onto a glass substrate, followed by a time period t where an application of silver nanowires suspended in ethanol of about 5 mg/ml concentration embeds the silver nanowires into the film of ITO nanoparticles atop the substrate. Selection of the time period t influences the degree of embedding, morphological arrangement of the silver nanowires, and the depth of embedding of the silver nanowires, and certain conductivities and transparencies can be attained by selection of the time period t. The embedded film is then thermally annealed, and processing parameters can be adjusted to tune properties of the resulting film. For example, a ratio of the metal precursors (e.g., 5:95 for Sn:In ratio) to oleylamine can be varied to yield different sized ITO nanoparticles (e.g., 7 nm diameter). Techniques can be used to arrange the ITO nanoparticles into various crystalline or amorphous configurations, such as close-packed superlattice structures. Seed-mediated growth of ITO nanoparticles also can be used to yield larger nanoparticles.

Example 10

Formation of Transparent Conductor

Figure 16:
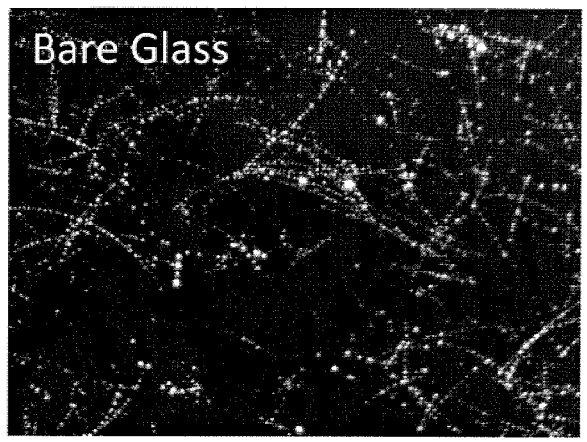
FIG. 16 includes microscope images illustrating heat stability of a transparent conductor.
Figure 16:
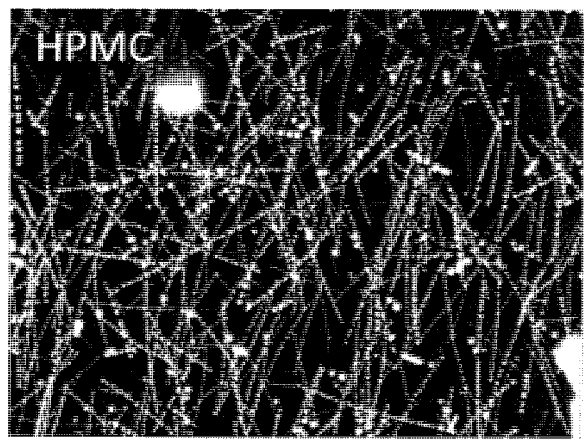
Figure 16:
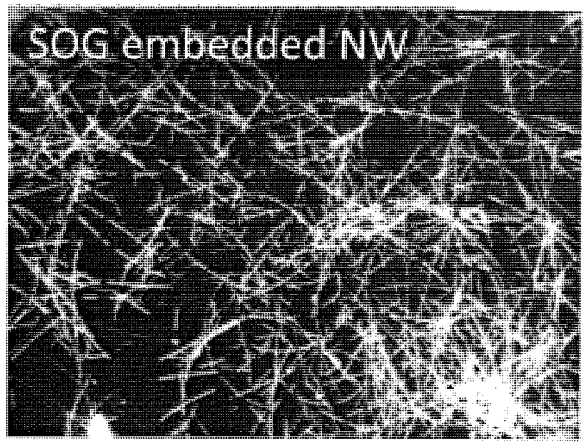

Conventional methods to coat silver nanowires onto glass are not high-temperature stable. Nanowires deposited onto glass decompose at about 550° C. (see FIG. 16, top). Nanowires coated within a conventional binder (hydroxypropyl methylcellulose or HPMC) similarly decompose into beads or nanoparticles (see FIG. 16, middle). In contrast, nanowires surface-embedded into a spin-on glass exhibit improved temperature stability (see FIG. 16, bottom). Prior to baking, the surface-embedded structure has $T_{luminous,\ excluding\ substrate}$=85% and $R_s$=20 Ohms/sq. After baking at 550° C., the surface-embedded structure has $T_{luminous,\ excluding\ substrate}$=89% and $R_s$=33 Ohms/sq.

Example 11

Formation of Transparent Conductor

Figure 17:
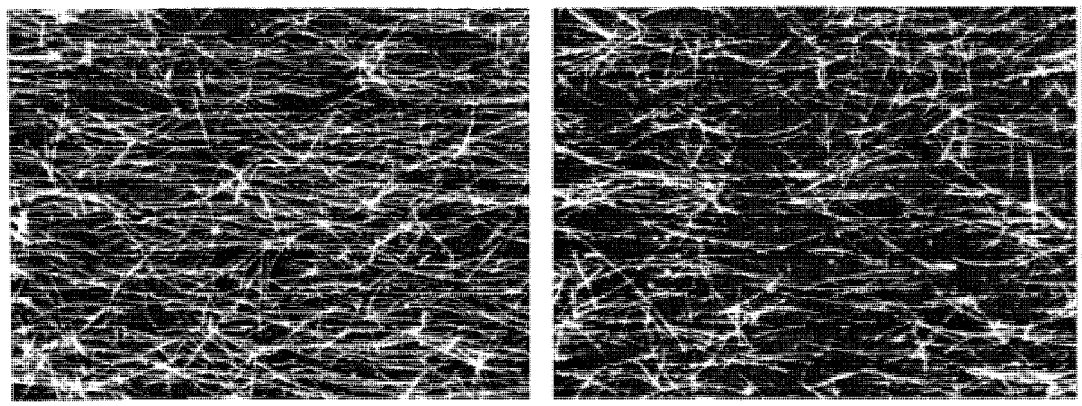
FIG. 17 includes microscope images illustrating heat stability of a transparent conductor.

A glass substrate is cleaned using 2 vol % Micro90 detergent, and scrubbed with a sponge followed by de-ionized water rinse, IPA rinse, and air knife dried. The glass substrate is treated with UVO for about 30 minutes prior to deposition. An ethanol solution of silver nanowires is then blade coated on top of the glass substrate at 0.25 to 0.6 mg/mL Subsequently, 20 nm of ITO is sputtered onto the surface. After ITO deposition, images are taken using an optical microscope prior to baking (see FIG. 17, left) and after baking to about 600° C. for about ½ hour (see FIG. 17, right). No degradation of the nanowires is observed from the images after baking.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A transparent conductor comprising:
   a film of a conductive ceramic; and
   additives at least partially incorporated into the film, the additives are at least one of electrically conductive and semiconducting, and at least one of the additives has an aspect ratio of at least 3, wherein the transparent conductor has a sheet resistance that is no greater than 1/10 of an intrinsic sheet resistance of the film, wherein the additives are at least partially embedded into the film and localized within an embedded region of the film, and a thickness of the embedded region is less than an overall thickness of the film.

2. The transparent conductor of claim 1, wherein the thickness of the embedded region is no greater than 30% of the overall thickness of the film.

3. A transparent conductor comprising:
   a film of a ceramic material, the film having an embedding surface and including partially fused nanostructures of the ceramic material; and
   additives partially embedded into the film and localized within an embedded region adjacent to the embedding surface, wherein a thickness of the embedded region is no greater than 50% of an overall thickness of the film, the additives are at least one of electrically conductive and semiconducting,
   further comprising an over-coating adjacent to the embedding surface and covering portions of the additives exposed from the ceramic material, wherein the ceramic material is a first ceramic material, and the over-coating includes a second ceramic material, wherein the first ceramic material and the second ceramic material are different.

4. A transparent conductor comprising:
   a film of a ceramic material, the film having an embedding surface and including partially fused nanostructures of the ceramic material; and
   additives partially embedded into the film and localized within an embedded region adjacent to the embedding surface, wherein a thickness of the embedded region is no greater than 50% of an overall thickness of the film, the additives are at least one of electrically conductive and semiconducting, further comprising an over-coating adjacent to the embedding surface and covering portions of the additives exposed from the ceramic material, wherein the ceramic material is a first ceramic material, and the over-coating includes a second ceramic material, wherein the second ceramic material has a dielectric constant in a range of 1.5 to 30.

* * * * *